(12) United States Patent
Strahm

(10) Patent No.: US 11,664,741 B2
(45) Date of Patent: May 30, 2023

(54) SYSTEM AND METHOD FOR AC POWER CONTROL

(71) Applicant: Susan Rhodes, McMinnville, OR (US)

(72) Inventor: Chris Norman Strahm, McMinnville, OR (US)

( * ) Notice: Subject to any disclaimer, the term of this patent is extended or adjusted under 35 U.S.C. 154(b) by 204 days.

(21) Appl. No.: 16/940,224

(22) Filed: Jul. 27, 2020

(65) Prior Publication Data

US 2021/0028721 A1 Jan. 28, 2021

Related U.S. Application Data

(60) Provisional application No. 62/878,640, filed on Jul. 25, 2019.

(51) Int. Cl.
*H02M 7/487* (2007.01)
*H02M 7/527* (2006.01)
(Continued)

(52) U.S. Cl.
CPC .......... *H02M 7/487* (2013.01); *H02M 7/527* (2013.01); *H03K 7/08* (2013.01); *H05B 39/041* (2013.01)

(58) Field of Classification Search
CPC ........ H02M 7/487; H02M 7/527; H03K 7/08; H05B 39/041
(Continued)

(56) References Cited

U.S. PATENT DOCUMENTS 4,979,218 A 12/1990 Strahm
5,170,437 A 12/1992 Strahm
(Continued)

FOREIGN PATENT DOCUMENTS

WO WO-2016110833 A2 * 7/2016 ............. A01G 31/02
WO WO-2017196572 A1 * 11/2017 ............... G05F 1/45
(Continued)

*Primary Examiner* — Thienvu V Tran
*Assistant Examiner* — Nusrat Quddus
(74) *Attorney, Agent, or Firm* — Kolisch Hartwell, P.C.

(57) ABSTRACT

A power-control device comprises an energy-import portion and an energy-export portion. The power-control device may additionally include a general processing and power supply circuit providing linear control of the power-control device's production of power to the load. The energy-import portion is coupled between a $V_{LINE}$ terminal and a load terminal, and is capable of importing energy to the load terminal during a first portion and a third portion of an alternating voltage $V_{AC}$ waveform. The energy-export portion is coupled between the load terminal and a NEU terminal, and is capable of exporting energy from the load terminal during a second portion and a fourth portion of the alternating voltage $V_{AC}$ waveform. The first, second, third and fourth portions of the alternating voltage $V_{AC}$ waveform are equal to a period of the alternating voltage $V_{AC}$ waveform and respectively are consecutive during the period of the alternating voltage $V_{AC}$ waveform. The power-control device provides variable power control to the load terminal in response to a variable on/off time of a PWM control signal.

18 Claims, 19 Drawing Sheets

(51) Int. Cl.
*H05B 39/04* (2006.01)
*H03K 7/08* (2006.01)

(58) Field of Classification Search
USPC ............ 363/84, 101, 56, 111, 106; 323/908
See application file for complete search history.

(56) References Cited

U.S. PATENT DOCUMENTS

| | | | | |
|---|---|---|---|---|
| 5,684,663 | A * | 11/1997 | Mitter | H02H 9/025 361/106 |
| 5,742,463 | A * | 4/1998 | Harris | H02H 9/025 361/111 |
| 5,781,390 | A * | 7/1998 | Notaro | H02H 11/003 361/84 |
| 6,163,712 | A * | 12/2000 | Winkler | H02H 9/001 323/908 |
| 6,346,778 | B1 | 2/2002 | Mason et al. | |
| 6,529,355 | B1 * | 3/2003 | Becker | G01R 1/36 361/101 |
| 6,970,337 | B2 | 11/2005 | Strahm | |
| 8,288,958 | B2 | 10/2012 | Rinaldi | |
| 8,289,065 | B2 | 10/2012 | Honea et al. | |
| 8,970,128 | B2 | 3/2015 | Newman, Jr. | |
| 10,892,741 | B2 * | 1/2021 | Tokumasu | H03K 3/012 |
| 2002/0071230 | A1 * | 6/2002 | Colclaser | H01L 27/0266 361/56 |
| 2002/0079849 | A1 | 6/2002 | Mason et al. | |
| 2007/0236152 | A1 * | 10/2007 | Davis | H05B 39/048 315/209 R |
| 2009/0096384 | A1 | 4/2009 | Vanderzon | |
| 2011/0148326 | A1 * | 6/2011 | Wang | H05B 45/10 315/307 |
| 2011/0187272 | A1 * | 8/2011 | Flaherty | H05B 47/11 315/149 |
| 2011/0199016 | A1 | 8/2011 | Rinaldi | |
| 2012/0019971 | A1 * | 1/2012 | Flaherty | H01H 47/325 361/93.4 |
| 2014/0126261 | A1 * | 5/2014 | Newman, Jr. | H05B 45/37 363/128 |
| 2015/0108913 | A1 * | 4/2015 | Newman, Jr. | H05B 45/10 315/209 R |
| 2016/0013733 | A1 * | 1/2016 | Pregitzer | H02M 7/08 363/126 |
| 2017/0070161 | A1 * | 3/2017 | MacAdam | H05B 45/3575 |
| 2018/0359835 | A1 * | 12/2018 | Moorthy | H02M 7/217 |
| 2020/0106259 | A1 * | 4/2020 | Telefus | H02H 1/0007 |
| 2020/0106260 | A1 * | 4/2020 | Telefus | H02H 3/10 |
| 2020/0196412 | A1 * | 6/2020 | Telefus | H05B 45/305 |
| 2020/0365346 | A1 * | 11/2020 | Telefus | H01H 9/56 |
| 2020/0365356 | A1 * | 11/2020 | Telefus | H01H 9/56 |
| 2020/0366079 | A1 * | 11/2020 | Telefus | H01H 71/04 |
| 2020/0366188 | A1 * | 11/2020 | Bollinger | H05B 45/10 |
| 2021/0014947 | A1 * | 1/2021 | Telefus | H05B 45/44 |
| 2021/0119528 | A1 * | 4/2021 | Telefus | H02H 3/08 |
| 2021/0226441 | A1 * | 7/2021 | Telefus | H02H 3/162 |

FOREIGN PATENT DOCUMENTS

| | | | | |
|---|---|---|---|---|
| WO | WO-2018081619 | A2 * | 5/2018 | ......... G01R 19/2513 |
| WO | WO-2019133110 | A1 * | 7/2019 | ............. H02M 1/08 |

* cited by examiner

SYSTEM AND METHOD FOR AC POWER CONTROL

RELATED APPLICATIONS

This application claims the benefit of U.S. Provisional Application No. 62/878,640, filed Jul. 25, 2019, and incorporated herein by reference in its entirety for all purposes.

FIELD OF THE DISCLOSURE

The field of the present disclosure includes systems for providing AC power control, such as control of power from a utility-generated sine wave to a load that may be resistive, inductive, capacitive or a mixed load. The field includes a power control device that may operate as a dimmer switch.

BACKGROUND OF THE DISCLOSURE

Prior devices for power control used conduction-angle modulation of utility-generated sine wave voltage for power control. Such modulation has been, and continues to be, one of the most widely employed methods of variable power control used worldwide due to its simplicity and high efficiency, which is typically on the order of 99%. Applications include heating, lighting, motor control, etc.

Conduction-angle modulation for power control generally uses a Pulse Width Modulated (PWM) control signal that drives a power-control switching device to enable energy transfer from a utility-generated sine wave $V_{AC}$ to a load only during specific portions of the period of the sine wave waveform. Variable power control is provided by varying the on/off time of the PWM control signal. Thyristors (e.g., Silicon Controlled Rectifiers (SCRs) and Triodes for Alternating Current (TRIACs)) have historically been used as the power-control switching devices.

Thyristors are simple devices and offer very little control. Once a thyristor has been triggered to turn on, the thyristor remains on until the current through the thyristor falls to zero. which generally occurs at the next zero crossing of the input sine wave. As such, the conduction angle utilized must always be lagging, that is, at the "back" portion of each sine wave half cycle so that the next zero crossing turns the thyristor off.

There is an abrupt transition of power transferred to a load that occurs for lagging conduction-angle control when a thyristor turns on. The abrupt transition of voltage and current creates detrimental EMI effects that often cause interference with other electronic equipment. The traditional technique for reducing the effects of EMI has been to add an inductor in the current path to slow the rate of current rise to the load.

FIG. 1 depicts a conventional thyristor-based power-control device 100 that includes a choke circuit for reducing EMI. A utility-generated sine wave voltage $V_{AC}$ is applied between a $V_{LINE}$ terminal and a Neutral (NEU) terminal and is switched on/off to a load $R_L$ through a TRIAC Q101. A PWM control signal $W_{PWM}$ is applied through a driver D101 to control when TRIAC Q101 is triggered. A choke circuit CH101 is coupled to the output of TRIAC Q101 and comprises a choke inductor L101 and a resistance R101. A choke circuit is often added to a power-control device 100 to controllably slow the voltage and current rise to the load $R_L$, to mitigate EMI-related problems. A snubber circuit SN101 is coupled across TRIAC Q101 and comprises a resistor R102 and a capacitor C102. A snubber circuit is often coupled across a thyristor to manage problematic behavior with reactive loads.

FIG. 2 depicts conceptualized conduction-angle modulation waveforms for $V_{LINE}$, $V_{LOAD}$, and $W_{PWM}$ for the conventional power-control device 100 of FIG. 1. In particular, the conduction-angle modulation waveform for $W_{PWM}$ depicts a conduction angle control signal of nominally 50%. TRIAC Q101 is triggered at the peak of the $V_{LINE}$ sinewave by $W_{PWM}$. TRIAC Q101 remains on for the duration of a half cycle, and the voltage $V_{LOAD}$ is transferred to load $R_L$. The shaded areas of the $V_{LINE}$ waveform shown in FIG. 2 represent the portion of the $V_{AC}$ voltage in which the half-cycle modulation of $W_{PWM}$ is applied. The "lagging-angle" PWM modulation depicted in FIG. 2 causes thyristor Q101 to turn on "hard" during the middle of the $V_{LINE}$ waveform and causes a severe shock and abrupt voltage transition for load $R_L$. Inductor L101 of choke circuit CH101 reduces the inherently fast rise time of the $V_{LOAD}$ output from TRIAC Q101 to decrease any generated EMI, as depicted by the dashed line in the $V_{LINE}$ and $V_{LOAD}$ waveforms. Often this causes the inductor of a choke circuit or lighting filaments of a load to audibly sing or buzz.

FIGS. 3A-3C respectively depict simulated TRIAC signal waveforms for the conventional power-control device 100 for a resistive load. The abscissa for each of FIG. 3A-3C is time in milliseconds (ms), and the ordinate for each of FIGS. 3A-3C is voltage in Volts (V). The simulation conditions for FIGS. 3A-3C are $V_{AC}$=120 $V_{RMS}$, $R_L$=14.4Ω, $I_L$=8.33 $A_{RMS}$ for 100% duty cycle. Thus, PL=1000 Watts. At 50% duty cycle the load power becomes PL=VAC×IL×50%=500 W. It should be noted that although the time begins at t=0 ms in each of FIGS. 3A-3C, it should be understood that the specific times indicated are relative and have been selected for convenience, and that the waveforms depicted are in a steady-state condition. Also, although the frequency of $V_{LINE}$ is 50 Hz, other frequencies for $V_{LINE}$ are possible.

FIG. 3A depicts the waveform for the voltage $V_{TRIAC}$ across TRIAC Q101, which is indicated as a solid line. FIG. 3A also depicts the waveform for the voltage $V_{LOAD}$ across the load, which is indicated as a dotted line. FIG. 3B depicts the waveform for the voltage $V_{INDUCTOR}$ across choke inductor L101, which is indicated as a solid line superimposed on the voltage across the load $V_{LOAD}$, which is indicated as a dotted line. FIG. 3C depicts the waveform for the PWM control signal $W_{PWM}$.

At time t=5 ms in FIGS. 3A-3C, the $W_{PWM}$ signal (FIG. 3C) turns on at the peak of the positive half cycle of $V_{LINE}$, and TRIAC Q101 begins to conduct. In FIG. 3A, TRIAC Q101 turns on at t=5 ms and the voltage $V_{TRIAC}$ (solid line) across TRIAC Q101 drops to 0 V (neglecting the internal resistance of TRIAC Q101). The voltage $V_{LOAD}$ (dotted line) across the load $R_L$ increases to $V_{LINE}$. In FIG. 3B, the voltage $V_{INDUCTOR}$ (solid line) across choke inductor L101 rises to $V_{LINE}$ and decays based on the time constant of L101 and R101, and the voltage $V_{LOAD}$ (dotted line) across the load $R_L$ increases to $V_{LINE}$. At time t=10 ms, $V_{LINE}$ begins a negative half cycle, the $W_{PWM}$ signal (FIG. 3C) turns off, and TRIAC Q101 turns off.

At time t=15 ms, the $W_{PWM}$ signal turns on for the negative half cycle of $V_{LINE}$, and TRIAC Q101 begins to conduct. In FIG. 3A, the voltage $V_{TRIAC}$ (solid line) across TRIAC Q101 drops to 0 V, and the voltage $V_{LOAD}$ (dotted line) across the load $R_L$ decreases to $V_{LINE}$. In FIG. 3B, the voltage $V_{INDUCTOR}$ (solid line) across choke inductor L101 drops to $V_{LINE}$ and decays based on the time constant of L101 and R101. The voltage $V_{LOAD}$ (dotted line) across the load $R_L$ drops to $V_{LINE}$. At time t=20 ms, $V_{LINE}$ begins another positive half cycle, the $W_{PWM}$ signal (FIG. 3C) turns off, and TRIAC Q101 turns off.

The signal waveforms for a resistive load shown in FIGS. 3A-3C appear similar to the conceptualized waveforms of FIGS. 2A-2C. Thyristor power control, however, has notorious problems with reactive complex loads due to the voltage and current no longer being in phase, and because a thyristor turns off only when the current through the thyristor goes to zero.

FIGS. 4A-4C respectively depict simulated TRIAC signal waveforms for the conventional power-control device 100 for an inductive load ($Z_L$=+45°. The abscissa for each of FIG. 4A-4C is time in milliseconds (ms), and the ordinate for each of FIGS. 4A-4C is voltage in Volts (V). The simulation conditions for FIGS. 4A-4C are $V_{AC}$=120 $V_{RMS}$, $Z_L$=14.4Ω at +45°, and $I_L$=8.33 $A_{RMS}$. For a $Z_L$ of 14.4Ω at +45° and 50 Hz, the resistive component $R_L$ is 10.18Ω and the inductive component $X_L$ is j10.18Ω (i.e., 32.41 mH at 50 Hz). For reasons described below, the power delivered to the resistive-inductive load is greater than the desired power of $P_L$=353 W at 50% duty cycle, so the desired 50% dimming does not occur. It should be understood that, compared to the power that was delivered to the purely resistive load, with a 14.4 ohm reactive load with a real part of 10.18 ohms, the maximum power that can be delivered to the load is 706.34 watts. Again, it should be noted that although the time begins at t=0 ms in each of FIGS. 4A-4C, it should be understood that the specific times indicated are relative and have been selected for convenience, and that the waveforms depicted are in a steady-state condition. Also, although the frequency of $V_{LINE}$ is 50 Hz, other frequencies for $V_{LINE}$ are possible.

An oscillatory behavior of TRIAC Q101 driving an inductive load can be seen in FIGS. 4A-4C. In particular, TRIAC Q101 is on for 75% of the half cycles in contrast to the 50% duty cycle of the $W_{PWM}$ waveform. In FIG. 4A, the voltage $V_{TRIAC}$ (solid line) across TRIAC Q101 exhibits the oscillatory behavior during the positive half cycle of $V_{LINE}$ (0-10 ms) prior to the $W_{PWM}$ signal turning on at t=5 ms (see FIG. 4C). At t=5 ms, TRIAC Q101 begins to conduct and the voltage $V_{TRIAC}$ across TRIAC Q101 drops to 0 V (neglecting the internal resistance of TRIAC Q101). In FIG. 4B, the voltage $V_{LOAD}$ (solid line) across the inductive load also exhibits an oscillatory behavior during the positive half cycle of $V_{LINE}$ prior to the $W_{PWM}$ signal turning on. At time t=10 ms, VLINE begins a negative half cycle (10-20 ms) and the $W_{PWM}$ signal turns off.

Prior to the $W_{PWM}$ signal turning on during the negative half cycle of VLINE at time t=15 ms, the voltage $V_{TRIAC}$ across TRIAC Q101 (solid line, FIG. 4A) again exhibits an oscillatory behavior. At t=15 ms, TRIAC Q101 begins to conduct in response to $W_{PWM}$ turning on and the voltage $V_{TRIAC}$ across TRIAC Q101 drops to 0 V. In FIG. 4B, the voltage $V_{LOAD}$ across the inductive load drops to $V_{LINE}$ (solid line) at t=15 ms. At time t=20 ms, $V_{LINE}$ begins another positive half cycle and the $W_{PWM}$ signal turns off.

FIGS. 5A-5C respectively depict simulated TRIAC signal waveforms for power-control device 100 for a capacitive load ($Z_L$=−45°. The abscissa for each of FIG. 5A-5C is time in milliseconds (ms), and the ordinate for each of FIGS. 5A-5C is voltage in Volts (V). The simulation conditions for FIGS. 5A-5C are $V_{AC}$=120 $V_{RMS}$, $Z_L$=14.4Ω at −45°, and $I_L$=8.3 $A_{RMS}$. For a $Z_L$ of 14.4Ω at −45° and 50 Hz, the resistive component $R_L$ is 10.18Ω and the capacitive component $X_L$ is −j10.18Ω (i.e., 312.7 μF at 50 Hz). For reasons described below, the power delivered to the resistive-capacitive load is not the $P_L$=500 W at 50% duty cycle that was delivered to the purely resistive load, but rather the power is not reduced at all from the nominal power, and so no dimming occurs. Again, it should be noted that although the time begins at t=0 ms in each of FIGS. 5A-5C, it should be understood that the specific times indicated are relative and have been selected for convenience, and that the waveforms depicted are in a steady-state condition. Also, although the frequency of $V_{LINE}$, is 50 Hz, other frequencies for $V_{LINE}$ are possible.

The waveforms of FIGS. 5A-5C for the capacitive load depict complete power-control failure in which TRIAC Q101 remains turned on for the entire period and completely unable to follow the $W_{PWM}$ control signal. As depicted in FIG. 5A, the voltage $V_{TRIAC}$ (solid line) across TRIAC Q101 is equal to 0 V at all times. In FIG. 5B, the voltage $V_{LOAD}$ (solid line) across the resistive-capacitive load is the same as $V_{LINE}$ throughout the cycle of $W_{PWM}$ depicted in FIG. 5C, i.e., the TRIAC is not providing any reduction of the power delivered to the load.

SUMMARY OF THE DISCLOSURE

The subject matter disclosed herein relates to a power-control device that enables energy transfer from a utility-generated sine wave $V_{AC}$ to a load in which the load can be resistive, inductive or capacitive. The subject matter disclosed herein also enables a power control device to transfer energy stored into the load back to its source, i.e., energy transfer is bidirectional.

One exemplary embodiment provides a power-control device that comprises a $V_{LINE}$ terminal, a load terminal, a neutral (NEU) terminal, an energy-import portion, and an energy-export portion. The energy-import portion is coupled between the $V_{LINE}$ terminal and the load terminal. The energy-import is capable of importing energy to the load terminal during a first portion and a third portion of an alternating voltage $V_{AC}$ waveform if the alternating voltage $V_{AC}$ is coupled between the $V_{LINE}$ terminal and the NEU terminal. The energy-export portion is coupled between the load terminal and the NEU terminal. The energy-import portion is capable of exporting energy from the load terminal during a second portion and a fourth portion of the alternating voltage $V_{AC}$ waveform if the alternating voltage $V_{AC}$ is coupled between the $V_{LINE}$ terminal and the NEU terminal. The sum of the first, second, third and fourth portions of the alternating voltage $V_{AC}$ waveform are equal to a period of the alternating voltage $V_{AC}$ waveform and respectively are consecutive during the period of the alternating voltage $V_{AC}$ waveform.

In one exemplary embodiment, the energy-import portion comprises a first MOSFET and a second MOSFET. The first MOSFET comprises a first terminal, a second terminal and a control terminal in which the first terminal of the first MOSFET is coupled to the $V_{LINE}$ terminal. The second MOSFET comprises a first terminal, a second terminal and a control terminal in which the second terminal of the second MOSFET is coupled to the second terminal of the first MOSFET and the first terminal of the second MOSFET is coupled to the load terminal. The term MOSFET is used in a generic sense and is represents any two or more terminal electronic devices used to control the flow of current that can be wither voltage controlled, current controlled or field controlled.

In one exemplary embodiment, the energy-export section comprises a third MOSFET and a fourth MOSFET. The third MOSFET comprises a first terminal, a second terminal and a control terminal in which the first terminal of the third MOSFET is coupled to the load terminal. The fourth MOSFET comprises a first terminal, a second terminal and a control terminal in which the second terminal of the fourth MOSFET being coupled to the second terminal of the third MOSFET and the first terminal of the fourth MOSFET being coupled to the NEU terminal.

In one exemplary embodiment, the energy-import section further comprises a first driver and a second driver, and the energy-export section further comprises a third driver and a fourth driver. The first driver comprises an output coupled to the control terminal of the first MOSFET. The first driver is capable of outputting a first drive signal in response to a first pulse width modulation (PWM) control signal in which the first PWM signal corresponds to the first portion of alternating voltage $V_{AC}$ waveform. The second driver comprises an output coupled to the control terminal of the second MOSFET. The second driver is capable of outputting a second drive signal in response to a second PWM control signal in which the second PWM signal corresponds to the third portion of the alternating voltage $V_{AC}$ waveform. The third driver comprises an output coupled to the control terminal of the third MOSFET. The third driver is capable of outputting a third drive signal in response to a third PWM control signal in which the third PWM signal corresponds to the second portion of the alternating voltage $V_{AC}$ waveform. The fourth driver comprises an output coupled to the control terminal of the fourth MOSFET. The fourth driver is capable of outputting a fourth drive signal in response to a fourth PWM control signal in which the fourth PWM signal corresponds to the fourth portion of the alternating voltage $V_{AC}$ waveform.

In one exemplary embodiment, the first driver is capable of outputting a first synchronous rectification drive signal in response to a first synchronous rectification control signal in which the first synchronous rectification control signal corresponds to the third and fourth portions of the alternating voltage $V_{AC}$ waveform. In one exemplary embodiment, the second driver is capable of outputting a second synchronous rectification drive signal in response to a second synchronous rectification control signal in which the second synchronous rectification control signal corresponds to the first and second portions of the alternating voltage $V_{AC}$ waveform. In one exemplary embodiment, the third driver is capable of outputting a third synchronous rectification drive signal in response to a third synchronous rectification control signal in which the third synchronous rectification control signal corresponds to the third and fourth portions of the alternating voltage $V_{AC}$ waveform. In one exemplary embodiment, the fourth driver is capable of outputting a fourth synchronous rectification drive signal in response to a fourth synchronous rectification control signal in which the fourth synchronous rectification control signal corresponds to the first and second portions of the alternating voltage $V_{AC}$ waveform. It will be understood that each drive signal includes two components: A PWM control signal, and a synchronous rectifier signal that turns on the device in question.

In one exemplary embodiment, the energy-import section further comprises a first optical isolator and a second optical isolator, and the energy-export section further comprises a third optical isolator and a fourth optical isolator. The first optical isolator comprises an input and an output in which the input of the first optical isolator is configured to receive the first PWM control signal and the first synchronous rectification control signal, and the output of the first optical isolator is coupled to the first driver. The second optical isolator comprises an input and an output in which the input of the second optical isolator is configured to receive the second PWM control signal and the second synchronous rectification control signal, and the output of the second optical isolator is coupled to the second driver. The third optical isolator comprises an input and an output in which the input of the third optical isolator is configured to receive the third PWM control signal and the third synchronous rectification control signal, and the output of the third optical isolator is coupled to the third driver. The fourth optical isolator comprises an input and an output in which the input of the fourth optical isolator is configured to receive the fourth PWM control signal and the fourth synchronous rectification control signal, and the output of the fourth optical isolator is coupled to the fourth driver.

In one exemplary embodiment, the energy-import section further comprises a first power source, and the energy-export section further comprises a second power source. The first power source comprises a first terminal and a second terminal in which the first terminal of the first power source is coupled to the second terminal of the first MOSFET and the second terminal of the second MOSFET, and the second terminal of the first power source is coupled to the first and second drivers and the first and second optical isolators. The second power source comprises a first terminal and a second terminal in which the first terminal of the second power source is coupled to the second terminal of the third MOSFET and the second terminal of the fourth MOSFET, and the second terminal of the second power source is coupled to the third and fourth drivers and the third and fourth optical isolators.

In one exemplary embodiment, the power-control device further comprises a processing and power source section. The processing and power source section comprises a PWM waveform processor and a transformer. The PWM waveform processor is capable of receiving a main PWM control signal and generating the first through fourth PWM control signals and the first through fourth synchronous rectification control signals. The transformer comprises a primary winding and a first and second secondary windings in which the primary winding is capable of being coupled to the alternating voltage $V_{AC}$, the first secondary winding is capable of being coupled to the first power source and the second secondary winding is capable of being coupled to the second power source.

One exemplary embodiment provides a power-control device, comprising a $V_{LINE}$ terminal, a load terminal, a neutral (NEU) terminal, and a first linear-switching device. The first linear-switching device is coupled between the $V_{LINE}$ terminal and the load terminal. The first linear-switching device comprises a first MOSFET, a first voltage supply, a first driver, a second MOSFET and a second driver. The first MOSFET comprises a first terminal, a second terminal and a control terminal. The first terminal of the first MOSFET is coupled to the $V_{LINE}$ terminal. The first MOSFET is turned on in response to a first portion of a first control signal that is coupled to the control terminal and is turned off in response to a second portion of the first control signal. The first voltage supply is isolated from the NEU terminal, and comprises a first terminal coupled to the second terminal of the first MOSFET and a second terminal of the second MOSFET. The first driver is isolated from the NEU terminal. The first driver comprises an input, an output and a power terminal. The output of the first driver couples the first control signal to the control terminal of the first MOSFET in response to a main control signal received from a signal source that is isolated from the first driver. The first driver power terminal is coupled to the second terminal of the first voltage supply. The second MOSFET comprises a first terminal, a second terminal and a control terminal. The first terminal of the second MOSFET is coupled to the load terminal, and the second terminal of the second MOSFET is coupled to the second terminal of the first MOSFET. The second MOSFET is turned on in response to a first portion of a second control signal that is coupled to the control terminal and is turned off in response to a fourth portion of the second control signal. The second driver is isolated from the NEU terminal. The second driver comprises an input, an output and a power terminal. The output of the second driver couples the second control signal to the control terminal of the second MOSFET in response to the main control signal received from the signal source, which is isolated from the second driver. The power terminal of the second driver is coupled to the second terminal of the first voltage supply. The first linear-switching device is capable of sourcing energy to the load terminal during a first portion and a third portion of an alternating voltage $V_{AC}$ waveform if the alternating voltage $V_{AC}$ is coupled between the $V_{LINE}$ terminal and the NEU terminal in which the first portion of the first control signal corresponds to the first portion of the alternating voltage $V_{AC}$, and the second portion of the second control signal corresponds to the third portion of the alternating voltage $V_{AC}$.

As noted above, each drive control signal has two components: a synchronous rectifier portion which is on for portions 1 & 2 or portions 3 & 4 of the sine wave and a PWM control signal for one of the half cycles. The sequence of either the synchronous rectifier or PWM signals is driver position dependent as shown in FIG. 10. In FIG. 10 drive signal W1 consists of a PWM signal first, and a synchronous rectifier signal second in a timed sequence from t=0. Generally, the synchronous rectification signal forces the MOSFETS into full conduction over the requisite half cycles In one exemplary embodiment, the power-control device further comprises a second linear-switching device coupled between the load terminal and the NEU terminal. The second linear-switching device comprises a third MOSFET, a second voltage supply, a third driver, a fourth MOSFET and a fourth driver. The third MOSFET comprises a first terminal, a second terminal and a control terminal. The first terminal of the third MOSFET is coupled to the $V_{LOAD}$ terminal. The third MOSFET is turned on in response to a first portion of a third control signal that is coupled to the control terminal. The second voltage supply is isolated from the NEU terminal. The second voltage supply comprises a first terminal coupled to the second terminal of the third MOSFET and a second terminal. The third driver is isolated from the NEU terminal. The third driver comprises an input, an output and a power terminal. The output of the third driver couples the third control signal to the control terminal of the third MOSFET in response to the main control signal received from the signal source, which is isolated from the third driver. The power terminal of the third driver is coupled to the second terminal of the second voltage supply. The fourth MOSFET comprises a first terminal, a second terminal and a control terminal. The first terminal of the fourth MOSFET is coupled to the load terminal. The second terminal of the fourth MOSFET is coupled to the second terminal of the third MOSFET. The fourth MOSFET is turned on in response to a first portion of a fourth control signal that is coupled to the control terminal and is turned off in response to a second portion of the fourth control signal. The fourth driver is isolated from the NEU terminal. The fourth driver comprises an input, an output, and a power terminal. The output of the fourth driver couples the fourth control signal to the control terminal of the fourth MOSFET in response to the main control signal received from the signal source, which is isolated from the fourth driver. The fourth driver power terminal is coupled to the second terminal of the second voltage supply. The second linear-switching device is capable of sinking energy from the load terminal during a second portion and a fourth portion of the alternating voltage $V_{AC}$ waveform if the alternating voltage $V_{AC}$ is coupled between the $V_{LINE}$ terminal and the NEU terminal in which the first, second, third and fourth portions of the alternating voltage $V_{AC}$ waveform span a period of the alternating voltage $V_{AC}$ waveform and respectively being consecutive during the period of the alternating voltage $V_{AC}$ waveform.

In one exemplary embodiment, the first linear-switching device further comprises a first feedback network and a second feedback network. The first feedback network is coupled between the first terminal and the control terminal of the first MOSFET. The first feedback network couples a first voltage transition at the first terminal of the first MOSFET to the control terminal of the first MOSFET. The first voltage transition is caused by the first MOSFET being turned off in response to the turning off of the first portion (PWM) of the first control signal. The second feedback network is coupled between the first terminal and the control terminal of the second MOSFET. The second feedback network couples a second voltage transition at the first terminal of the second MOSFET to the control terminal of the second MOSFET. The second voltage transition is caused by the second MOSFET being turned off in response to the second portion of the third control signal.

In one exemplary embodiment, the second linear-switching device further comprises a third feedback network and a fourth feedback network. The third feedback network is coupled between the first terminal and the control terminal of the third MOSFET. The third feedback network couples a third voltage transition at the first terminal of the third MOSFET to the control terminal of the third MOSFET. The third voltage transition is caused by the third MOSFET being turned off in response to the second portion of the third control signal. The fourth feedback network is coupled between the first terminal and the control terminal of the fourth MOSFET. The fourth feedback network couples a fourth voltage transition at the first terminal of the fourth MOSFET to the control terminal of the fourth MOSFET. The fourth voltage transition is caused by the fourth MOSFET being turned off in response to the fourth portion of the fourth control signal.

In one exemplary embodiment, the first control signal comprises a first pulse width modulation (PWM) control signal which controls the first portion of the alternating voltage VAC waveform and a first synchronous rectification drive signal that controls the third and fourth portions of the alternating voltage VAC waveform. In one exemplary embodiment, the second control signal comprises a first synchronous rectifier control signal which controls the first and second portions of the alternating voltage VAC waveform and a second pulse width modulation (PWM) control signal that controls the third portion of the alternating voltage VAC waveform. In one exemplary embodiment, the third control signal comprises a third pulse width (PWM) control signal which controls the third portion of the alternating voltage VAC waveform and a third pulse synchronous rectifier control signal that controls the second portion of the alternating voltage VAC waveform. In one exemplary embodiment, the fourth control signal comprises a first synchronous rectifier control signal which controls the first and second portions of the alternating voltage VAC waveform and a fourth pulse width modulation (PWM) control signal that controls the fourth portion of the alternating voltage VAC waveform.

In one exemplary embodiment, the first linear-switching device further comprises a first optical isolator and a second optical isolator. The first optical isolator comprises an input and an output. The input of the first optical isolator is configured to receive the first control signal, and the output of the first optical isolator is coupled to the first driver. The second optical isolator comprises an input and an output. The input of the second optical isolator is configured to receive the second control signal, and the output of the second optical isolator is coupled to the input of the second driver. In one exemplary embodiment, the second linear-switching device further comprises a third optical isolator and a fourth optical isolator. The third optical isolator comprises an input and an output. The input of the third optical isolator is configured to receive the third control signal, and the output of the third optical isolator is coupled to the input of the third driver. The fourth optical isolator comprises an input and an output. The input of the fourth optical isolator is configured to receive the fourth control signal, and the output of the fourth optical isolator is coupled to the input of the fourth driver.

In one exemplary embodiment, the power-control device further comprises a processing and power source section. The processing and power source section comprises a control waveform processor capable of receiving the main control signal and generating the first through fourth control signals. The transformer comprises a primary winding and first, second, and third secondary windings. The primary winding is capable of being coupled to the alternating voltage $V_{AC}$. The first secondary winding is capable of being coupled to the first voltage supply and the second secondary winding is capable of being coupled to the second voltage supply. The third winding supplies power to the processing and power source section.

Yet another exemplary embodiment provides a power-control device comprising a $V_{LINE}$ terminal, a load terminal, and a first linear-switching device. The first linear-switching device is coupled between the $V_{LINE}$ terminal and the load terminal. The first linear-switching device comprises a first MOSFET and a second MOSFET. The first MOSFET comprises a first terminal, a second terminal and a control terminal. The first terminal of the first MOSFET is coupled to the $V_{LINE}$ terminal. The second MOSFET comprises a first terminal, a second terminal and a control terminal. The second terminal of the second MOSFET is coupled to the second terminal of the first MOSFET and the first terminal of the second MOSFET is coupled to the load terminal. The first linear-switching device is capable of sourcing energy to the load terminal during a first portion and a third portion of an alternating voltage $V_{AC}$ waveform if the alternating voltage $V_{AC}$ is coupled to the $V_{LINE}$ terminal.

BRIEF DESCRIPTION OF THE DRAWINGS

The subject matter disclosed herein is illustrated by way of example and not by limitation in the accompanying figures in which like reference numerals indicate similar elements and in which.

DETAILED DESCRIPTION OF THE DISCLOSURE

Figure 1:
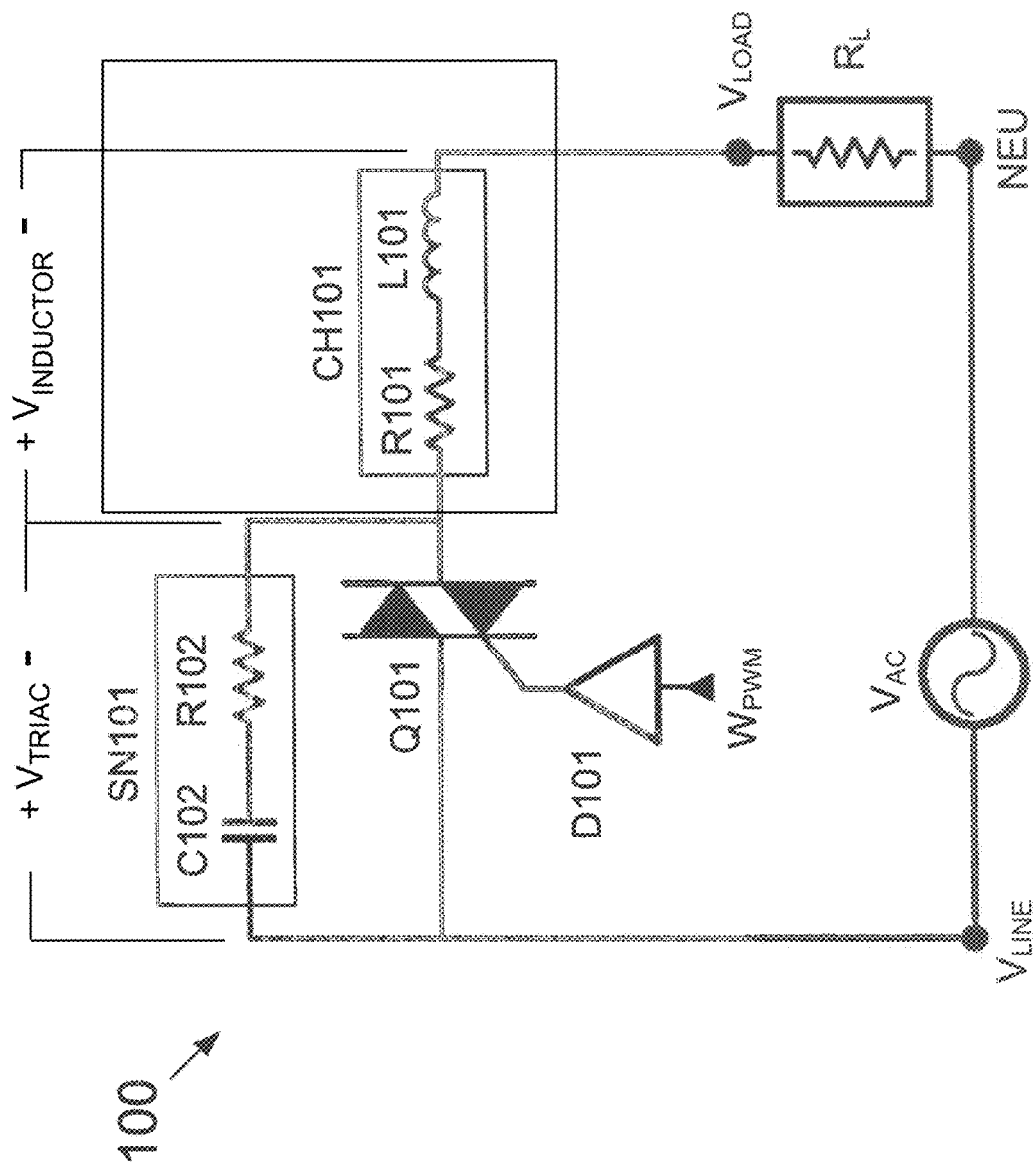
FIG. 1 depicts a conventional thyristor-based power-control device that includes a choke circuit for reducing EMI.

As used herein, the word "exemplary" means "serving as an example, instance, or illustration." Any embodiment described herein as "exemplary" is not to be construed as necessarily preferred or advantageous over other embodiments. Additionally, it will be appreciated that for simplicity and/or clarity of illustration, elements illustrated in the figures have not necessarily been drawn to scale. For example, the dimensions of some of the elements may be exaggerated relative to other elements for illustrative clarity. Further, in some figures only one or two of a plurality of similar elements are indicated by reference characters for illustrative clarity of the figure, whereas less than all of the similar elements may be indicated by reference characters. Further still, it should be understood that although some portions of components and/or elements of the subject matter disclosed herein have been omitted from the figures for illustrative clarity, good engineering, construction and assembly practices are intended.

The subject matter disclosed herein relates to a power-control device that enables energy transfer from a utility-generated sine wave $V_{AC}$ to a load in which the load can be resistive, inductive or capacitive. One exemplary embodiment of the subject matter disclosed herein provides variable power control to a load in response to a variable on/off time of a PWM control signal.

Energy should be supplied to a reactive load during a PWM "on" time, and be removed from the load during the PWM "off" time. One exemplary embodiment of the subject matter disclosed herein provides active charge and discharge control to two distinct circuit structures; one circuit structure handles the charging of a reactive load (i.e., the PWM "on" time) and the other circuit structure handles the discharging of the reactive load (i.e., the PWM "off" time).

Figure 6:
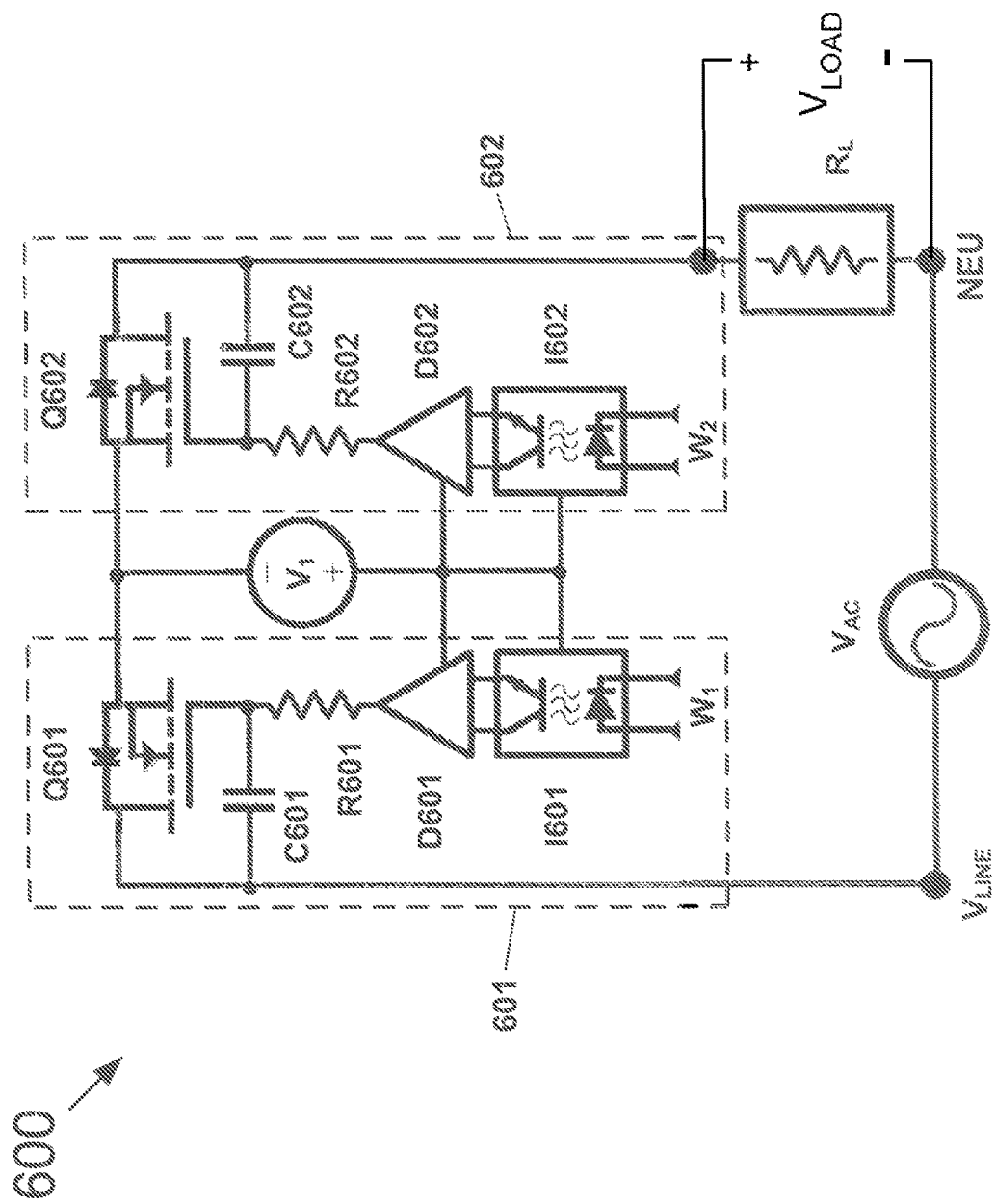
FIG. 6 depicts a functional block diagram of a first exemplary embodiment of a power-control circuit according to the subject matter disclosed herein.

FIG. 6 depicts a functional block diagram of a first exemplary embodiment of a power-control circuit 600 according to the subject matter disclosed herein. Power-control circuit 600 is configured to drive a resistive load, and may comprise two linear-switching stages 601 and 602 that are connected back-to-back between $V_{LINE}$ and load $Z_L$.

Linear-switching stage 601 comprises a Metal-Oxide-Semiconductor Field-Effect Transistor (MOSFET) Q601, a driver D601, and an optical isolator I601. The output of optical isolator I601 is coupled to the input of driver D601. The output of driver D601 is coupled to the gate of MOSFET Q601 through a resistor R601. A capacitor C601 is coupled between the drain and gate of MOSFET Q601 and provides closed-loop feedback around MOSFET Q601. In particular, capacitor C601 reduces the high-frequency gain of MOSFET Q601, thereby attenuating the frequency components generated by MOSFET Q601 as MOSFET Q601 switches between on/off states. Use of capacitor C601 as a feedback element along with resistor R601 linearizes the switching transition of MOSFET Q601 without affecting the static saturation characteristics of MOSFET Q601.

Linear-switching stage 602, which is paired with linear-switching stage 601, comprises a MOSFET Q602, a driver D602, and an optical isolator I602. The output of optical isolator I602 is coupled to the input of driver D602. The output of driver D602 is coupled to the gate of MOSFET Q602 through a resistor R602. A capacitor C602 is coupled between the drain and gate of MOSFET Q602 and provides closed-loop feedback around MOSFET Q602. As with switching stage 601, capacitor C602 and resistor R602 linearize the switching transition of MOSFET Q602 without affecting the static saturation characteristics MOSFET Q602.

The drain of MOSFET Q601 is coupled to $V_{LINE}$, and the drain of MOSFET Q602 is coupled to load $R_L$. The sources of MOSFETs Q601 and Q602 are coupled together. A floating, isolated voltage supply $V_1$ is connected to the sources of MOSFETs Q601 and Q602. Voltage supply V1 powers the gate drivers D601 and D602 and isolators I601 and I602. Supply $V_1$ tracks and floats with the changing voltage conditions across MOSFETs Q601 and Q602 to thereby maintain and facilitate a linear-switching feedback characteristic for MOSFETs Q601 and Q602.

Gate resistors R601 and Q602 are respectively driven from drivers D601 and D602, which in turn are respectively driven by isolators I601 and I602. PWM control waveforms $W_1$ and $W_2$ set the on/off periods of MOSFETs Q601 and Q602. The linear-switching characteristics and slope or turn-on time for MOSFETs Q601 and Q602 are respectively determined by the time constants of R601 and C601, and R602 and C602.

The time constants may be selected in accordance with known methodology for optimizing the linear-switching characteristics and slope or turn-on time for the MOSFETS. For example, as described below for FIGS. 8D-8F, the circuit component characteristics may be selected for a linear switching characteristic that is smooth and linear and with an adequate turn-off transition rate suited to the specifications for the particular application of the power-control device. For FIGS. 8D-8F the slew rate is limited to a rate of approximately 3V/usec.

Figure 2:
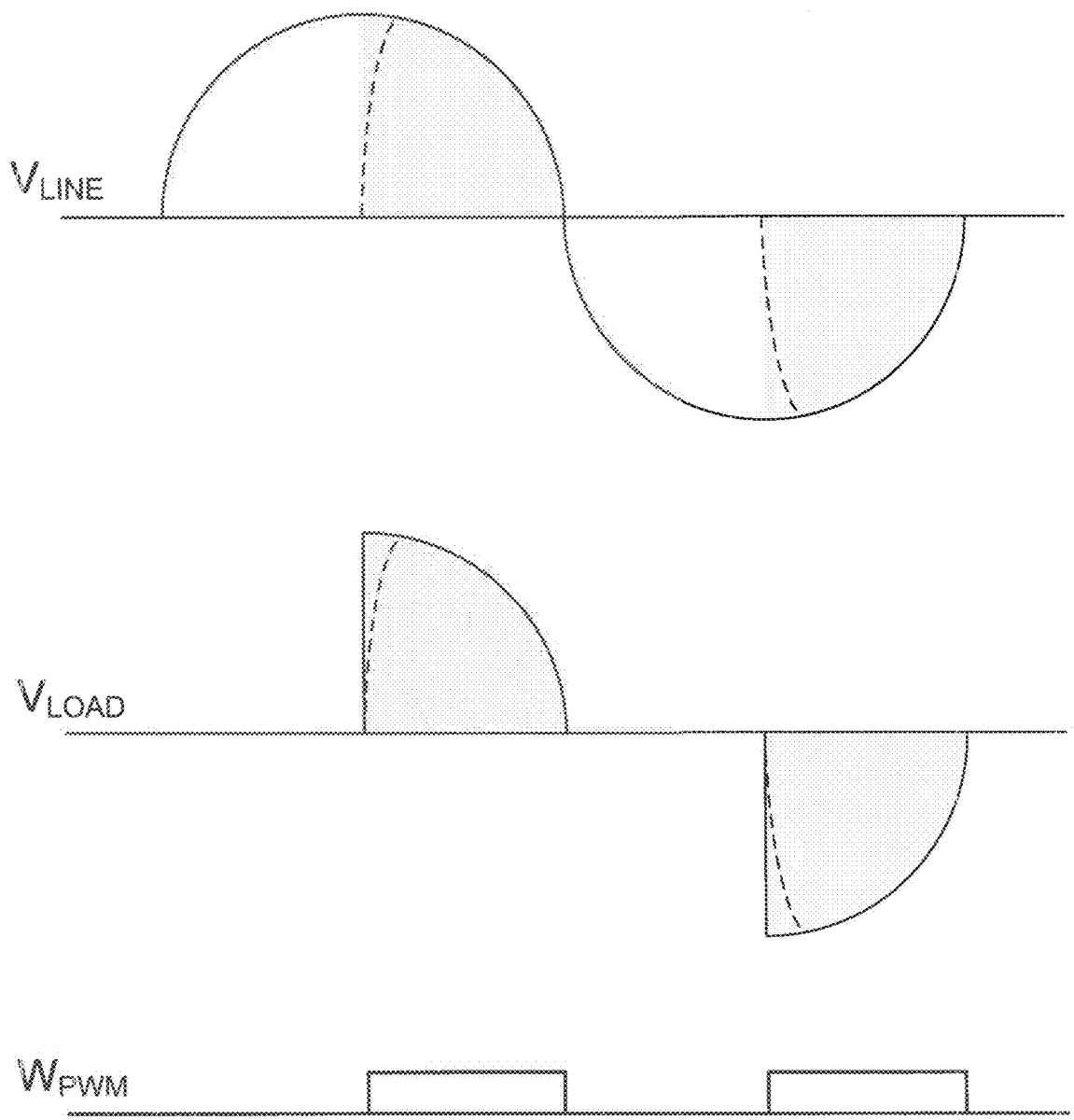
FIG. 2 depicts conceptualized conduction-angle modulation waveforms for $V_{LINE}$, $V_{LOAD}$ and $W_{PWM}$ for the conventional power-control device of FIG. 1.
Figure 3A:
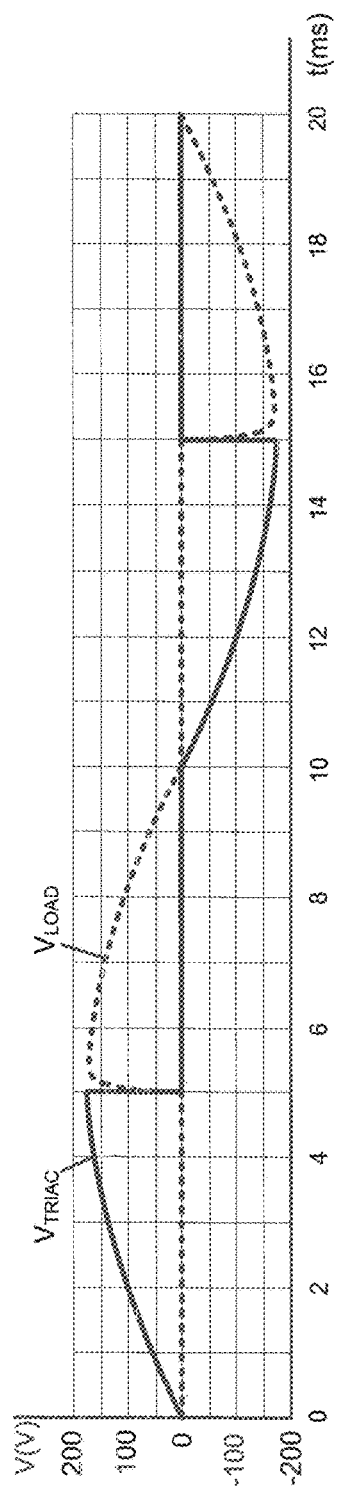
FIGS. 3A-3C respectively depict simulated TRIAC signal waveforms for the conventional power-control device of FIG. 1 for a resistive load.
Figure 3B:
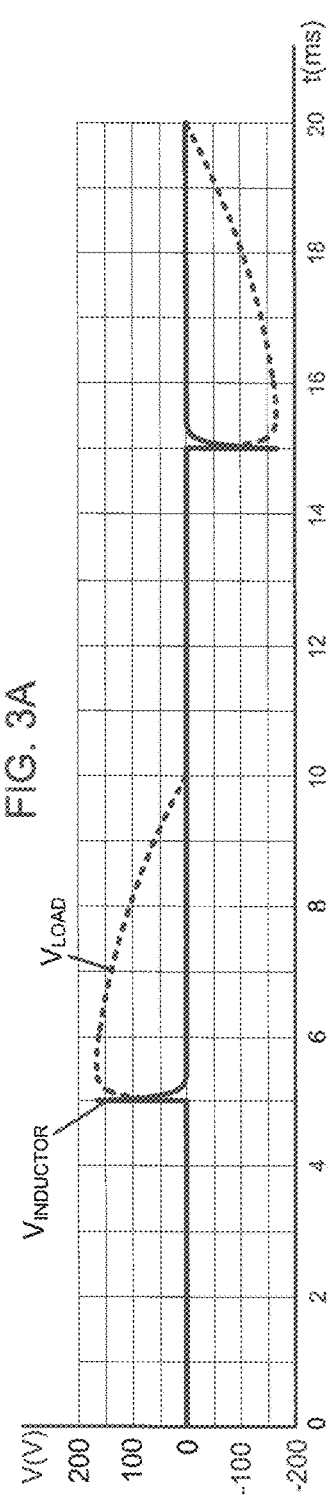
Figure 3C:
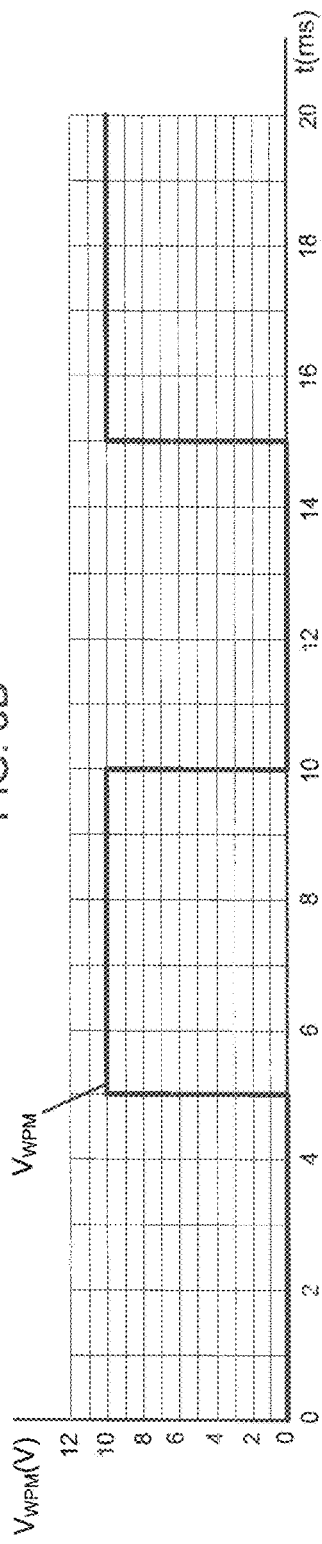
Figure 4A:
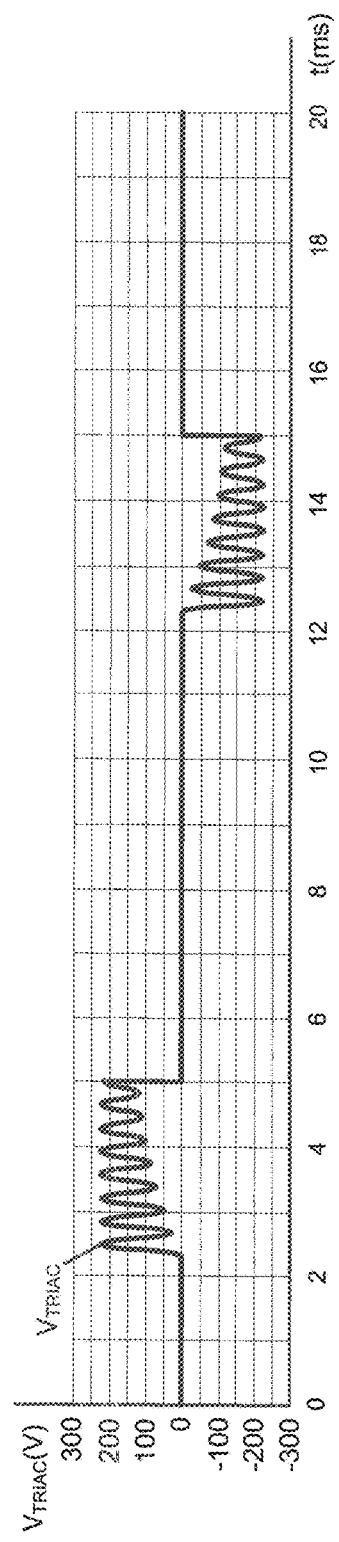
FIGS. 4A-4C respectively depict simulated TRIAC signal waveforms for the conventional power-control device of FIG. 1 for a resistive-inductive load ($Z_L$ at +45°)
Figure 4B:
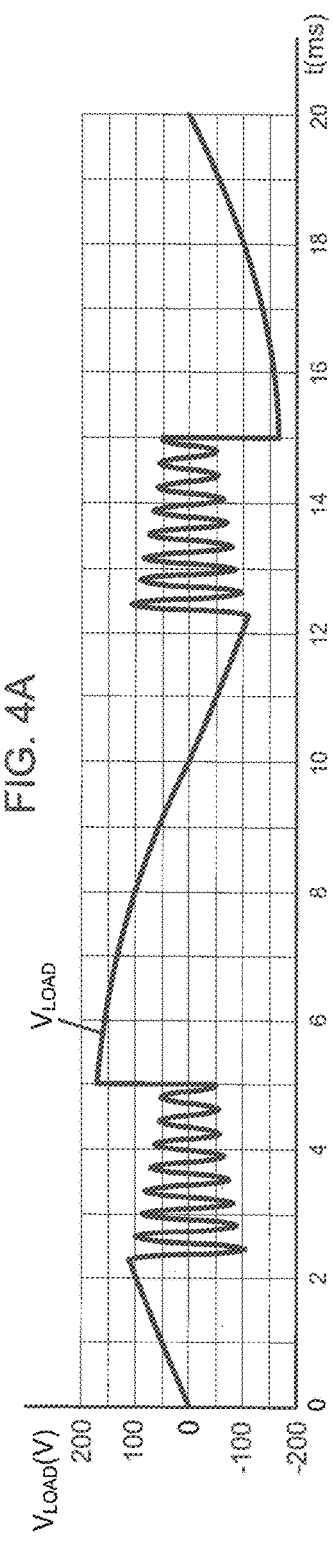
Figure 4C:
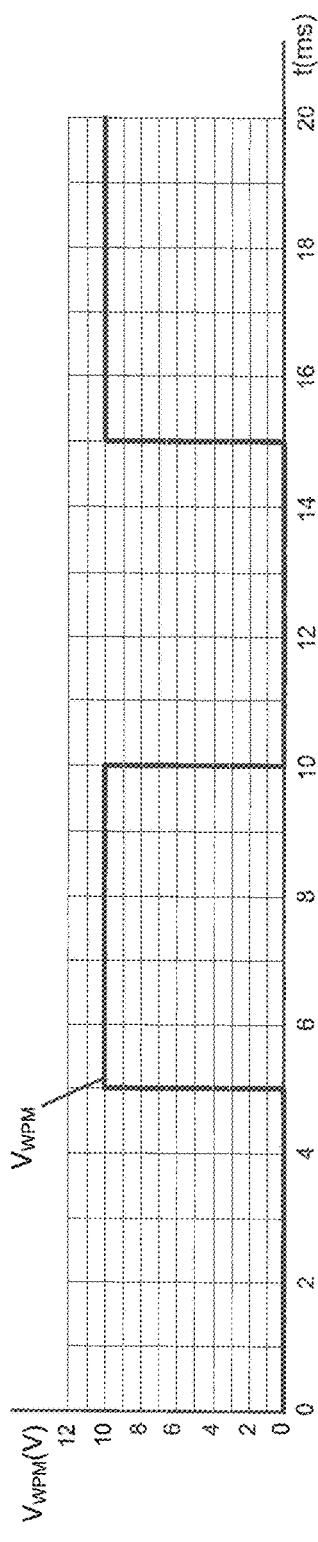
Figure 5A:
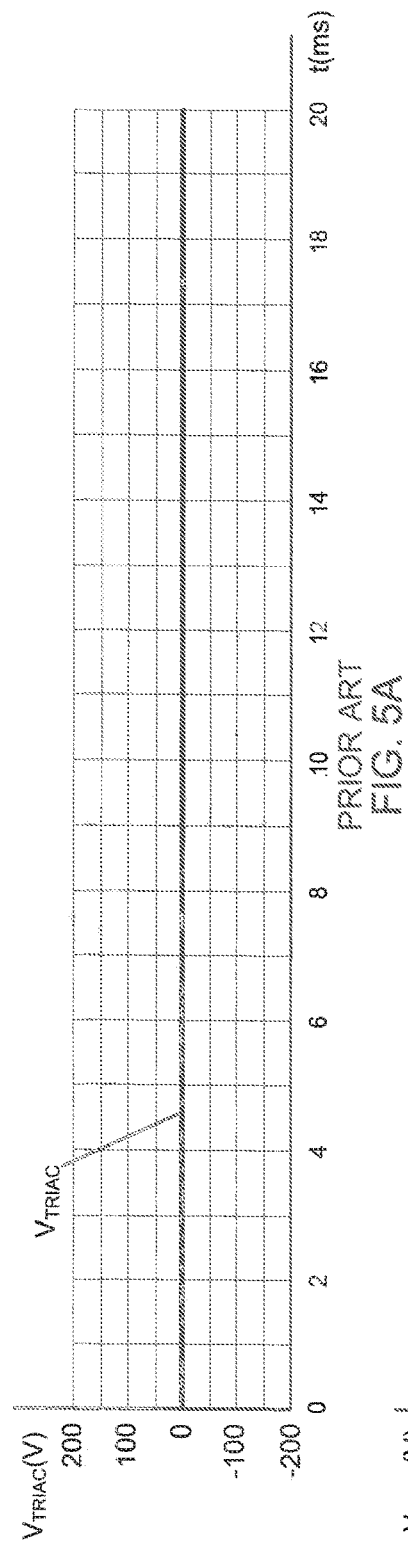
FIGS. 5A-5C respectively depict simulated TRIAC signal waveforms for the conventional power-control device of FIG. 1 for a resistive-capacitive load ($Z_L$ at −45°)
Figure 5B:
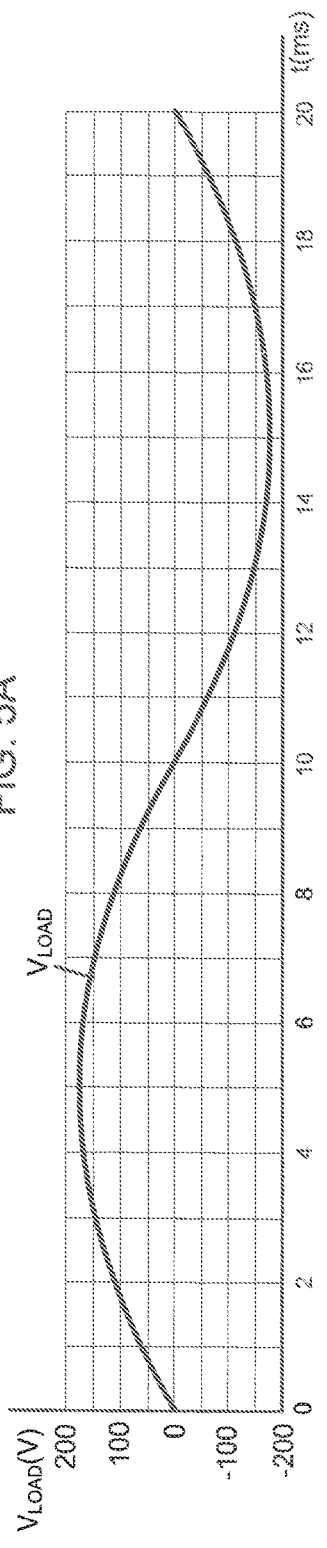
Figure 5C:
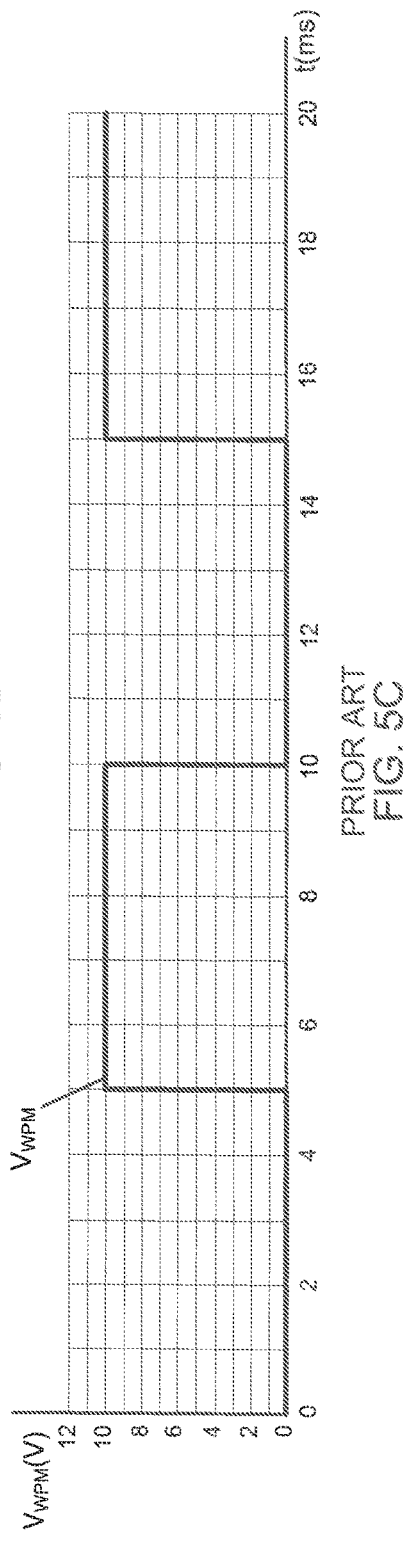
Figure 7:
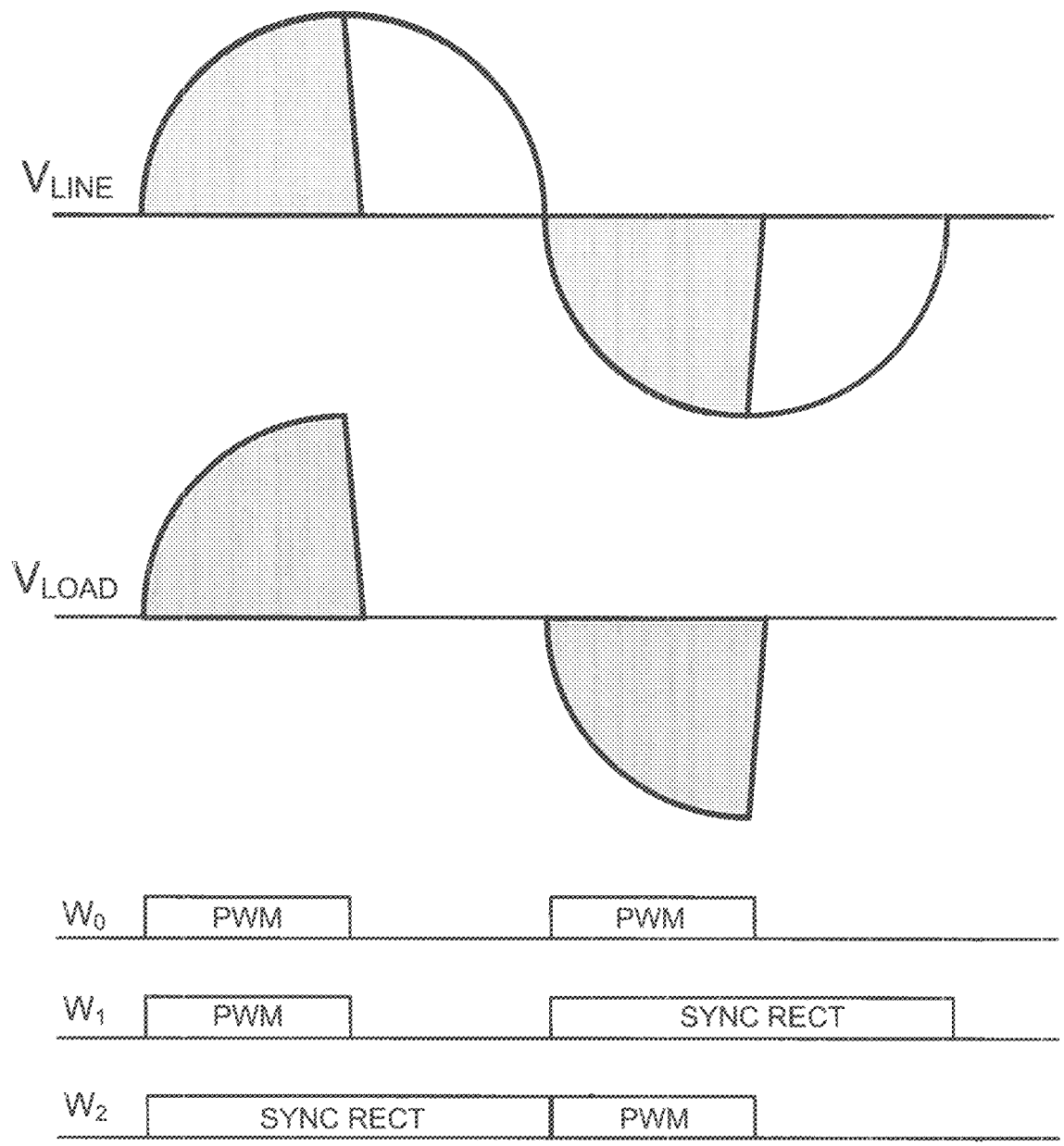
FIG. 7 depicts conceptualized conduction-angle modulation waveforms for $V_{LINE}$, $V_{LOAD}$, $W_0$, $W_1$ and $W_2$ for the power-control circuit of FIG. 6.

FIG. 7 depicts conceptualized conduction-angle modulation waveforms for $V_{LINE}$, $V_{LOAD}$, $W_0$, $W_1$ and $W_2$ for power-control circuit 600 of FIG. 6. The shaded areas in FIG. 7 represent the portion of $V_{AC}$ in which the half-cycle modulation is applied. Unlike the conceptualized thyristor conduction angle depicted in FIG. 2, which was lagging modulation, a leading-conduction angle modulation is depicted in FIG. 7. That is, the transition occurs as a turn-off transition instead of a turn-on transition, as was the case for device 100 in FIG. 1. A leading-conduction angle modulation allows the load voltage $V_{LOAD}$ to rise gradually with the relatively slow-moving sine wave of the low-frequency utility voltage $V_{AC}$ at the start of each half cycle, thereby reducing stress in all components including the load $R_L$. MOSFETs Q601 and Q602 turn on at the start of each half cycle and turn off at the end of the PWM "on" time. The linear transitions at the trailing edges of the $V_{LINE}$ and $V_{LOAD}$ waveforms have a reduced harmonic content in comparison to an abrupt transition.

In FIG. 7, waveform $W_0$ is the master PWM control signal and repeats every half cycle. Waveform $W_0$ is respectively divided in a well-known manner during the positive and negative half cycles of $V_{LINE}$ into waveforms $W_1$ and $W_2$ for alternating control of MOSFET Q601 and Q602. While one MOSFET is conducting in response to a PWM control drive signal, the internal substrate diode of the other MOSFET conducts because it is forward biased, and also in response to a PWM synchronous rectification (sync rect) drive signal to reduce the losses within the MOSFET to be less than that of the internal substrate diode alone by using the parallel $R_{ds}$ of the "other" MOSFET.

The resulting total power loss in the current path to the load is twice the MOSFET $R_{ds}$ multiplied by the square of the load current. No other diodes or bridge rectifiers are required in circuit 600, thus providing very high efficiency. The isolated, floating local supply $V_1$, the input isolators I601 and I602, and the gate-drive system of the MOSFET pair is entirely floating, thereby enabling proper linear-switching characteristics for power-control circuit 600.

During the positive half cycle of $V_{LINE}$, current flows from the $V_{LINE}$ terminal to the NEU terminal. Transistor Q601 operates as the controlling MOSFET in response to the PWM "on" time, while transistor Q602 operates as a synchronous rectifier enabled for the entire half cycle. During the negative half cycle of $V_{LINE}$, current flows from the NEU terminal to the $V_{LINE}$ terminal. MOSFET Q602 operates as the controlling MOSFET programmed with the PWM "on" time, while MOSFET Q601 operates as a synchronous rectifier enabled for the entire half cycle.

Figure 8A:
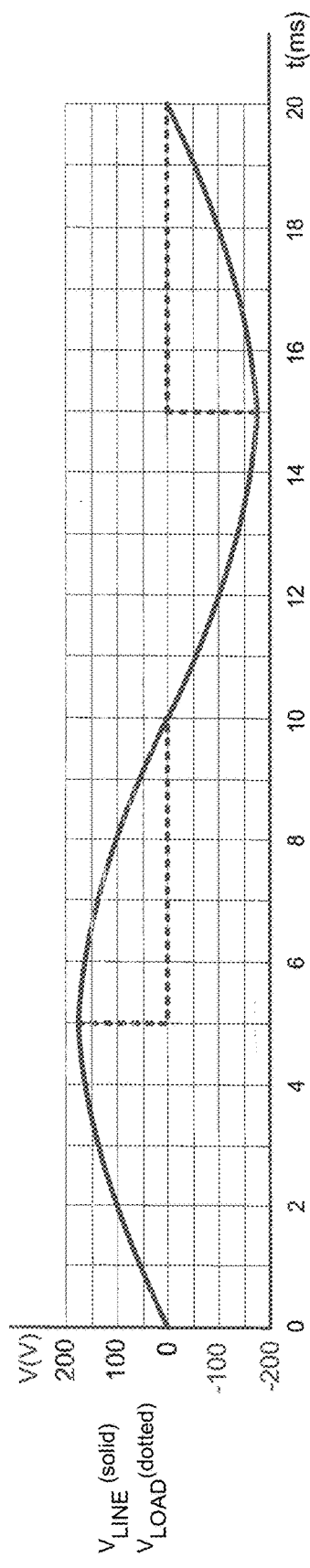
FIGS. 8A-8C depict a simulation of internal waveforms of the power-control device of FIG. 6 during a full sine wave period of $V_{LINE}$ for a conduction duty cycle of 50% for a resistive load.
Figure 8B:
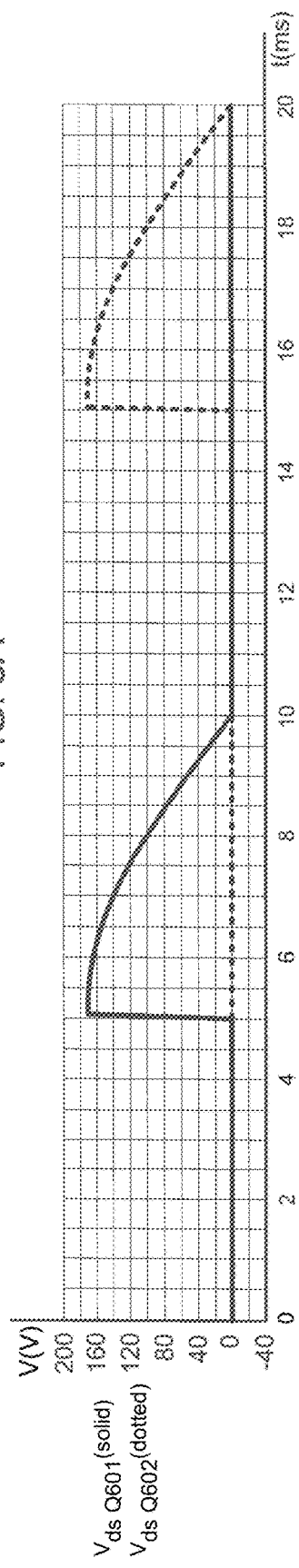
Figure 8C:
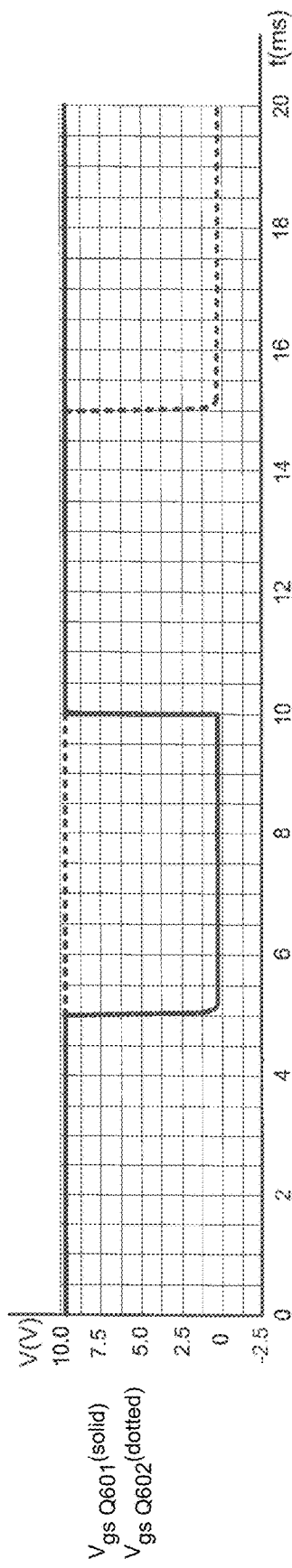

FIGS. 8A-8C depict a simulation of internal waveforms of power-control device 600 during a full sine wave period of $V_{LINE}$ for a conduction duty cycle of 50% for a resistive load. The simulation conditions for FIGS. 8A-8C are $V_{AC}$=120 $V_{RMS}$, $R_L$=14.4Ω, $I_L$=8.3 $A_{RMS}$, and power delivered to $R_L$ is $P_L$=500 W. The abscissa for each of FIG. 8A-8C is in milliseconds (ms), and the ordinate for each of FIGS. 8A-8C in Volts (V). It should be noted that the abscissas for FIGS. 8A-8C begin at t=0 ms. The specific time reference has been selected for convenience and that the waveforms are depicted in a steady state condition. The frequency of $V_{LINE}$ is 50 Hz.

FIG. 8A depicts the waveform for $V_{LINE}$ (solid line) superimposed over the waveform for $V_{LOAD}$ (dotted line). FIG. 8B depicts the waveform for voltage $V_{ds\ Q601}$ from drain to source of MOSFET Q601 (solid line) superimposed over the voltage $V_{ds\ Q602}$ from drain to source of MOSFET Q602 (dotted line). The linear-switching characteristics of the turn-off transition are smooth and linear. In this particular example, the turn-off transition requires about 55 μsec to slew about 170 V. This is about a slew rate of 3 V/μsec, and is comparable to what is generally seen in conventional thyristor and choke designs. FIG. 8C depicts the waveform for the voltage $V_{gs\ Q601}$ from gate to source of MOSFET Q601 (solid line) superimposed over the voltage $V_{gs\ Q602}$ from gate to source of MOSFET Q602 (dotted line).

Figure 8D:
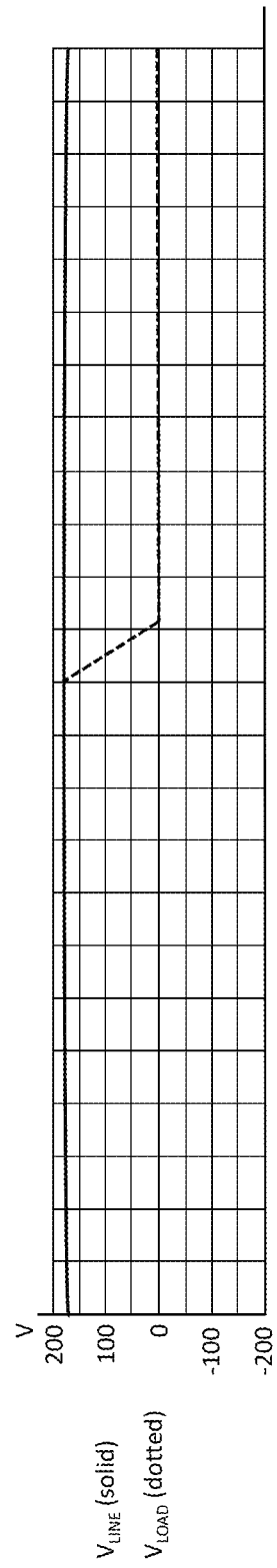
FIGS. 8D-8F respectively depict the simulated waveforms of FIGS. 8A-8C for t=4.5 ms to t=5.5 ms.
Figure 8E:
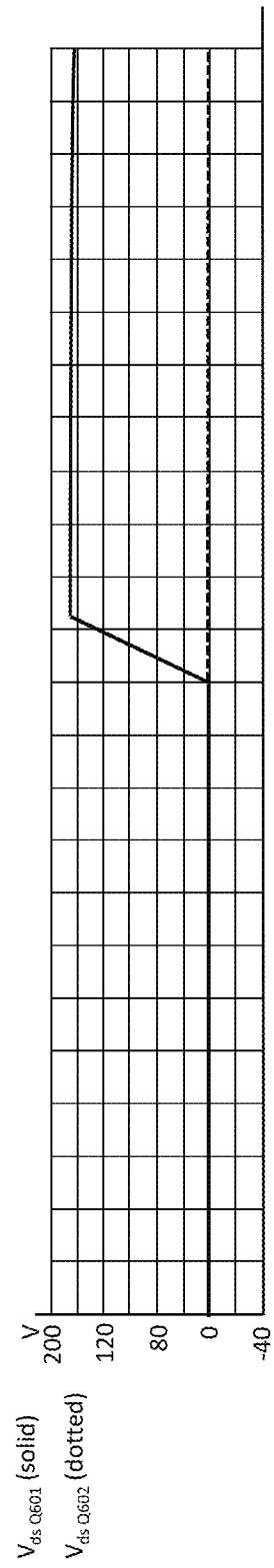
Figure 8F:
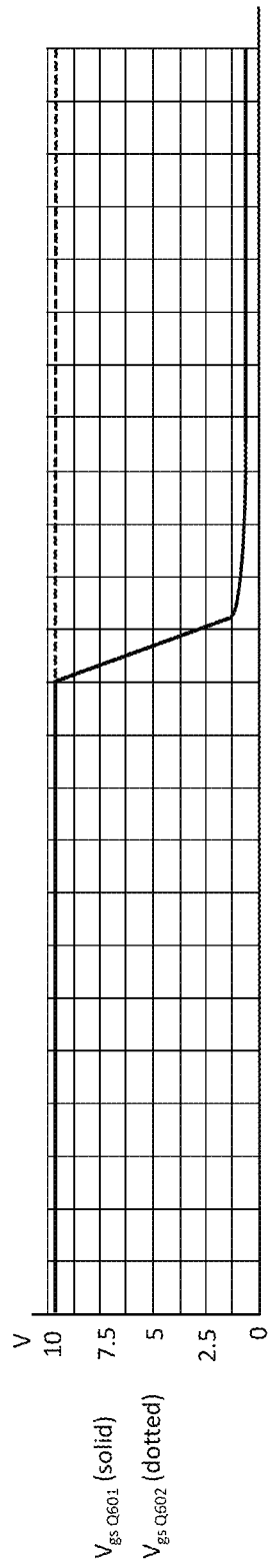

FIGS. 8D-8F respectively depict the simulated waveforms of FIGS. 8A-8C for t=4.5 ms to t=5.5 ms. Although the time scale has been expanded around t=5 ms and only the simulated waveform transitions associated with MOSFET Q601 are visible, the simulated waveforms associated with MOSFET Q602 are similar. The linear switching characteristic of MOSFET Q601 for the turn-off transition (FIG. 8D, $V_{LOAD}$; and FIG. 8E, $V_{ds\ Q601}$) is smooth and linear. In this particular example, the turn-off transition requires about 55 μs to slew about 170 V, which is a slew rate of about 3 V/μs.

Figure 9:
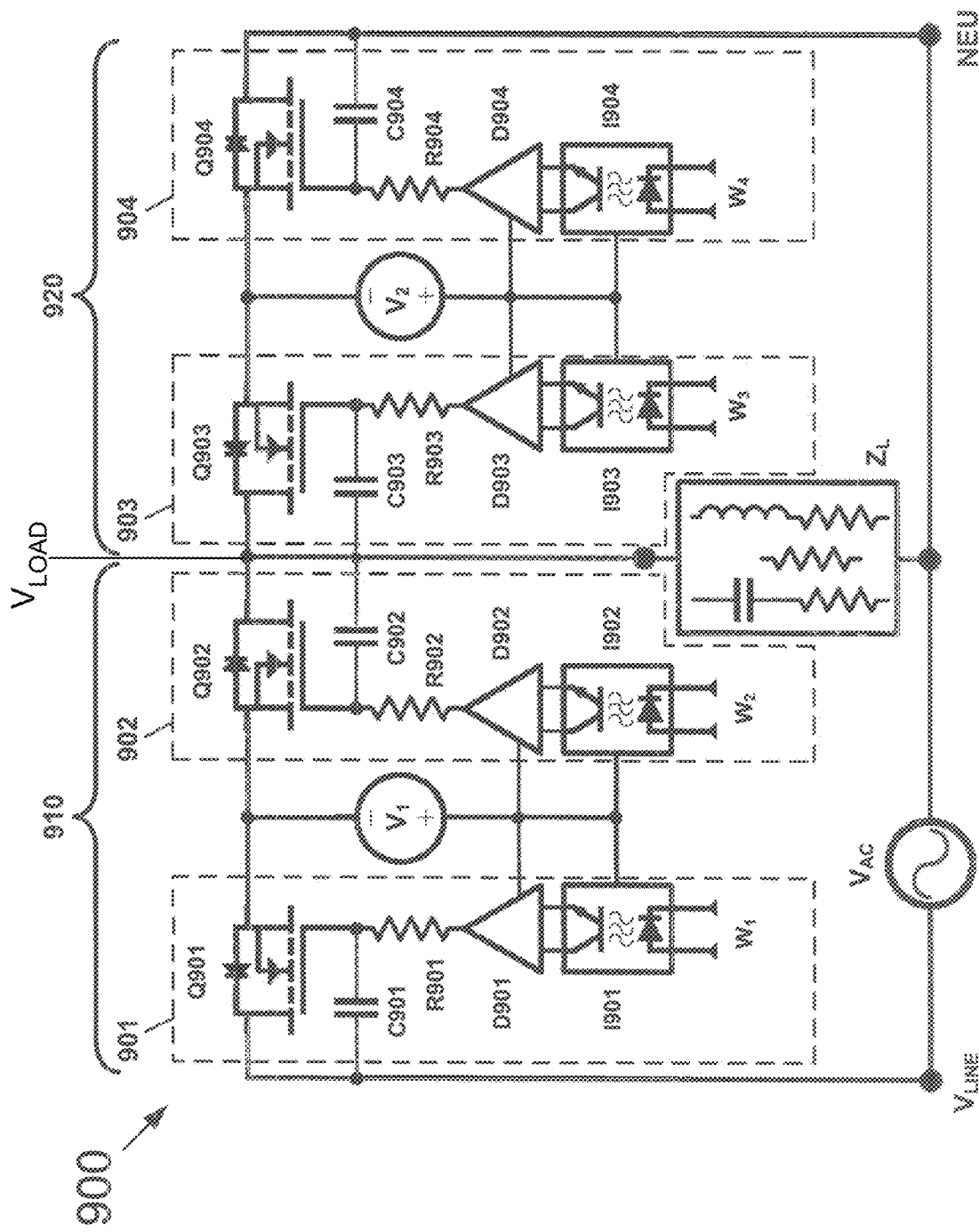
FIG. 9 depicts a functional block diagram of a second exemplary embodiment of a power-control device according to the subject matter disclosed herein.

FIG. 9 depicts a functional block diagram of a second exemplary embodiment of a power control device 900 according to the subject matter disclosed herein. Power-control device 900 is configured to drive any type of load—resistive, inductive or capacitive. Power control device 900 comprises an energy-import section 910 and an energy-export section 920. Energy-import section 910 charges a load $Z_L$ from $V_{LINE}$ during a PWM on time, and energy-export section 920 discharges the load $Z_L$ into the NEU terminal during the PWM off time.

Energy-import section 910 comprises two linear-switching stages 901 and 902 that are connected back-to-back between $V_{LINE}$ and $Z_L$. Energy-export section 920 comprises two linear-switching stages 903 and 904 that are connected back-to-back between load $Z_L$ and NEU.

Linear-switching stage 901 comprises a MOSFET Q901, a driver D901, and an optical isolator I901. The output of optical isolator I901 is coupled to the input of driver D901. The output of driver D901 is coupled to the gate of MOSFET Q901 through a resistor R901. A capacitor C901 is coupled between the drain and gate of MOSFET Q901 and provides closed-loop feedback around MOSFET Q901. In particular, capacitor C901 reduces the high-frequency gain of MOSFET Q901, thereby attenuating the frequency components generated by MOSFET Q901 as MOSFET Q901 switches between on/off states. Use of capacitor C901 as a feedback element along with resistor R901 linearizes the switching transition of MOSFET Q901 without affecting the static saturation characteristics Q901.

Linear-switching stage 902, which is paired with linear-switching stage 901, comprises a MOSFET Q902, a driver D902, and an optical isolator I902. The output of optical isolator I902 is coupled to the input of driver D902. The output of driver D902 is coupled to the gate of MOSFET Q902 through a resistor R902. A capacitor C902 is coupled between the drain and gate of MOSFET Q902 and provides closed-loop feedback around MOSFET Q902. As with switching stage 901, capacitor C902 and resistor R902 linearizes the switching transition of MOSFET Q902 without affecting the static saturation characteristics of MOSFET Q902.

The drain of MOSFET Q901 is coupled to $V_{LINE}$, and the drain of MOSFET Q902 is coupled to load $Z_L$. The sources of MOSFETs Q901 and Q902 are coupled together. A floating, isolated voltage supply $V_1$ is connected to the sources of MOSFETs Q901 and Q902. Voltage supply $V_1$ powers the gate drivers D901 and D902 and isolators I901 and I902. Supply $V_1$ tracks and floats with the changing voltage conditions across MOSFETs Q901 and Q902 to thereby maintain and facilitate a linear-switching feedback characteristic for MOSFETs Q901 and Q902.

Gate resistors R901 and R902 are respectively driven from drivers D901 and D902, which in turn are respectively driven by isolators I901 and I902. PWM control waveforms $W_1$ and $W_2$ set the on/off periods of MOSFETs Q901 and Q902. The linear-switching characteristics and slope for MOSFETs Q901 and Q902 are respectively determined by the time constants of R901 and C901, and R902 and C902. The time constants may be selected in accordance with known methodology for optimizing the linear-switching characteristics and slope for the MOSFETS. For example, the circuit component characteristics may be selected for a linear switching characteristic that is smooth and linear and with an adequate turn-off transition rate suited to the specifications for the particular application of the power-control device.

Linear-switching stage 903 comprises a MOSFET Q903, a driver D903, and an optical isolator I903. The output of optical isolator I903 is coupled to the input of driver D903. The output of driver D903 is coupled to the gate of MOSFET Q903 through a resistor R903. A capacitor C903 is coupled between the drain and gate of MOSFET Q903 and provides closed-loop feedback around MOSFET Q903. Capacitor C903 reduces the high-frequency gain of MOSFET Q903, thereby attenuating the frequency components generated by MOSFET Q903 as MOSFET Q903 switches between on/off states. The use of capacitor C903 as a feedback element along with resistor R903 linearizes the switching transition of MOSFET Q903 without affecting the static saturation characteristics.

Linear-switching stage 904, which is paired with linear-switching stage 903, comprises a MOSFET Q904, a driver D904, and an optical isolator I904. The output of optical isolator I904 is coupled to the input of driver D904. The output of driver D904 is coupled to the gate of MOSFET Q904 through a resistor R904. A capacitor C904 is coupled between the drain and gate of MOSFET Q904 and provides closed-loop feedback around MOSFET Q904. As with switching stage 903, capacitor C904 and resistor R904 linearizes the switching transition of MOSFET Q904 without affecting the static saturation characteristics.

The drain of MOSFET Q903 is coupled to $Z_L$, and the drain of MOSFET Q904 is coupled to the NEU terminal. The sources of MOSFETs Q903 and Q904 are coupled together. A floating, isolated voltage supply $V_2$ is also connected to the sources of MOSFETs Q903 and Q904. Voltage supply $V_2$ powers the gate drivers D903 and D904 and isolators I903 and I904. Supply $V_2$ tracks and floats with the changing voltage conditions across MOSFETs Q903 and Q904 to thereby maintain and facilitate a linear-switching feedback characteristic.

Gate resistors R903 and R904 are respectively driven from drivers D903 and D904, which in turn are respectively driven by isolators I903 and I904. PWM control waveforms $W_3$ and $W_4$ set the on/off periods of MOSFETs Q903 and Q904. The linear-switching characteristic and slope is determined by the time constants of R903 and C903, and R904 and C904. The time constants may be selected in accordance with known methodology for optimizing the linear-switching characteristics and slope for the MOSFETS. For example, the circuit component characteristics may be selected for a linear switching characteristic that is smooth and linear and with an adequate turn-off transition rate suited to the specifications for the particular application of the power-control device.

The substrate diodes of MOSFETs Q903 and Q904 provide a commutation function for energy-export section 920. Any inductive EMF voltage from the load will be suppressed by the conduction of the substrate diodes, thereby protecting both MOSFETs Q901 and Q902 from being driven below the NEU voltage. When the PWM off time begins, both MOSFETs Q903 and Q904 are placed into full conduction, thereby enabling discharge of a capacitive load reactance.

Figure 10:
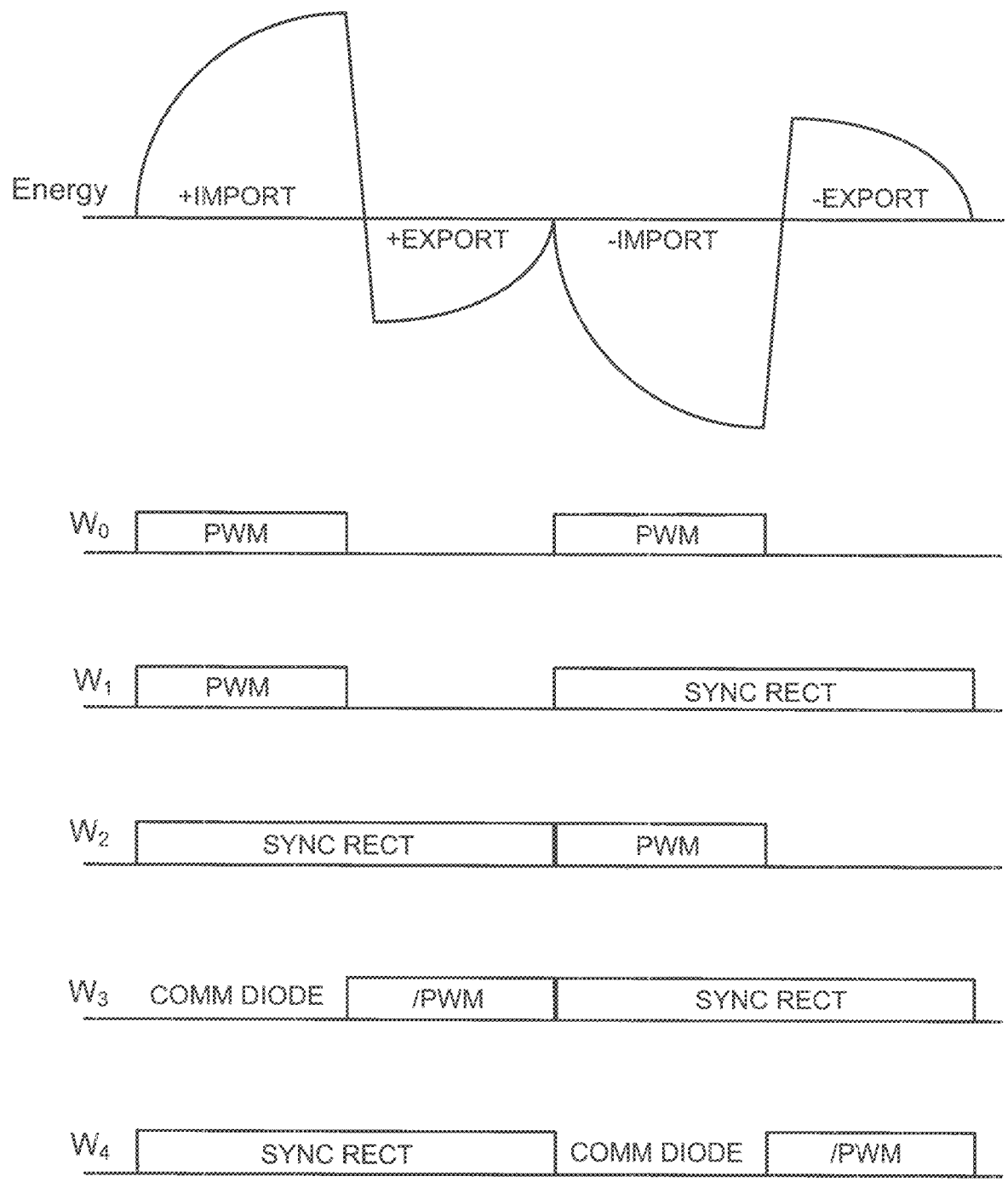
FIG. 10 depicts conceptualized conduction-angle modulation waveforms for the power-control device of FIG. 9.

FIG. 10 depicts conceptualized conduction-angle modulation waveforms for power-control device 900. In FIG. 10, the Energy waveform represents portions of a conceptualized waveform for $V_{LINE}$ in which energy-import section 910 imports, or sources, energy into load $Z_L$, and in which energy-export section 920 exports, or sinks, energy from load $Z_L$. That is, energy-import section 911 charges load $Z_L$, from $V_{LINE}$ during the on time of PWM signal $W_0$, and energy-export section 920 discharges load $Z_L$, into the NEU during the off time of PWM signal $W_0$.

Waveform $W_0$ is the master or main PWM control signal and repeats every half cycle. Waveform $W_0$ is respectively divided into waveforms $W_1$ and $W_2$ during the positive and negative half cycles for alternating control of MOSFETs Q901 and Q902. That is, while MOSFET Q901 is conducting under a PWM control drive signal, the internal substrate diode of MOSFET Q902 conducts as it is forward biased, and Q902 is forced into conduction in response to a PWM synchronous rectification (sync rect) drive signal in order to reduce the losses, which are less than that of the substrate diode alone because $R_{ds}$ of MOSFET Q902 is in parallel with the substrate diode. Similarly, while MOSFET Q902 is conducting in response to a PWM control drive signal, the internal substrate diode of MOSFET Q901 conducts as it is forward biased and Q901 is forced into conduction in response to a PWM synchronous rectification drive signal.

The complement of waveform $W_0$ (/$W_0$) is similarly divided into waveforms $W_3$ and $W_4$ during the positive and negative half cycles for alternating control of MOSFETs Q903 and Q904. While MOSFET Q903 is conducting in response to the /PWM control drive signal $W_3$, the internal substrate diode of MOSFET Q904 conducts as it is forward biased and also in response to a /PWM synchronous rectification (sync rect) drive signal, and while MOSFET Q904 is conducting in response to a /PWM control drive signal $W_4$, the internal substrate diode of MOSFET Q903 conducts as it is forward biased and also in response to a /PWM synchronous rectification drive signal.

Any potential issue of simultaneous conduction between energy-import section 910 and energy-export section 920 is managed using an RC time constant (R903/C903, R904/C904) for energy-export section 920 that typically is about twice that of the RC time constant (R901/C901, R902/C902) of energy-import section 910.

In operation, power control device 900 provides an output voltage $V_{LOAD}$ across load $Z_L$ that is identical for all three load-impedance conditions. Moreover, power-control device 900 provides that the voltages across the MOSFETs Q901-Q904 also remain identical or substantially identical in all three load-impedance cases.

Figure 11A:
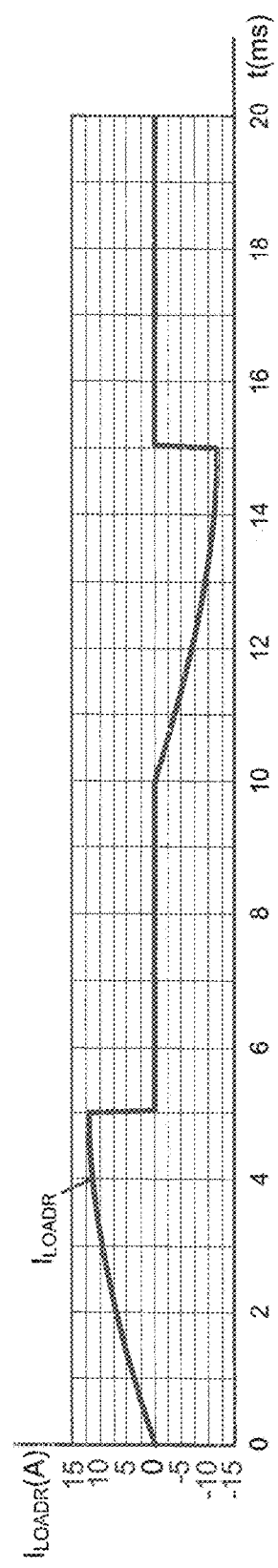
FIGS. 11A-11C respectively depict a simulation of load current $I_{LOAD}$ waveforms output from the power-control device of FIG. 9 during a full sine wave period for a conduction duty cycle of 50% for a resistive load ($I_{LOADR}$), a resistive-inductive load ($I_{LOADL}$), and a resistive-capacitive load ($I_{LOADC}$)
Figure 11B:
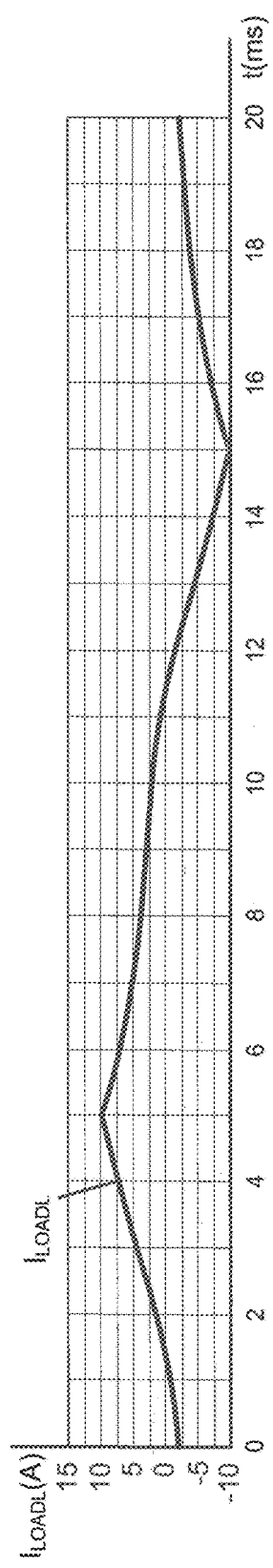
Figure 11C:
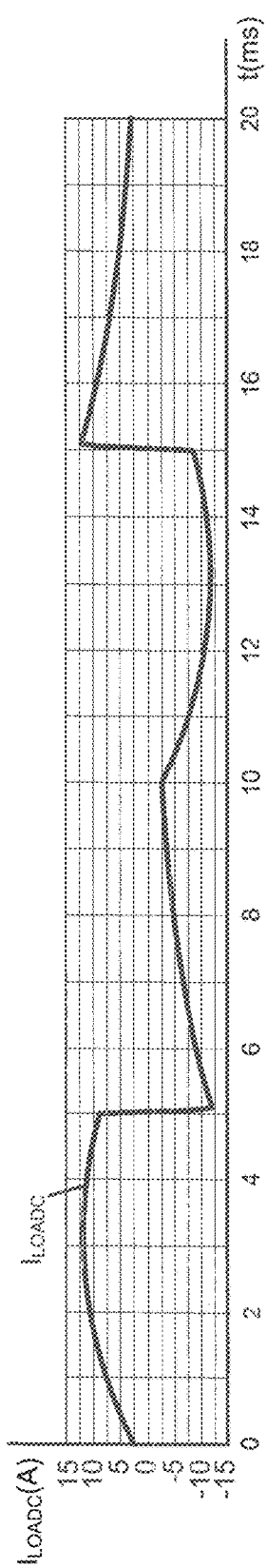

FIGS. 11A-11C respectively depict a simulation of load current $I_{LOAD}$ waveforms output from power-control device 900 during a full sine wave period for a conduction duty cycle of 50% for a resistive load ($I_{LOADR}$), an inductive load ($I_{LOADL}$), and a capacitive load ($I_{LOADC}$).

The resistive load current waveform $I_{LOADR}$ shown in FIG. 11A is intuitively easy to understand because the current waveform in a resistive load is proportional to and in phase with to the voltage waveform appearing across the resistive load. The same, however, cannot be said for reactive loads. A non-sinusoidal voltage waveform contains harmonics, and when applied to a reactive load, the harmonics produce current waveforms that appear entirely different from the voltage waveform. For the inductive and the capacitive reactive-load cases, respectively shown in FIGS. 11B and 11C, the load current remains active during all portions of the PWM on/off times, which is necessary for properly driving reactive loads. Only for the resistive load, shown in FIG. 11A, does the load current $I_{LOAD}$ abruptly fall to zero.

Figure 12A:
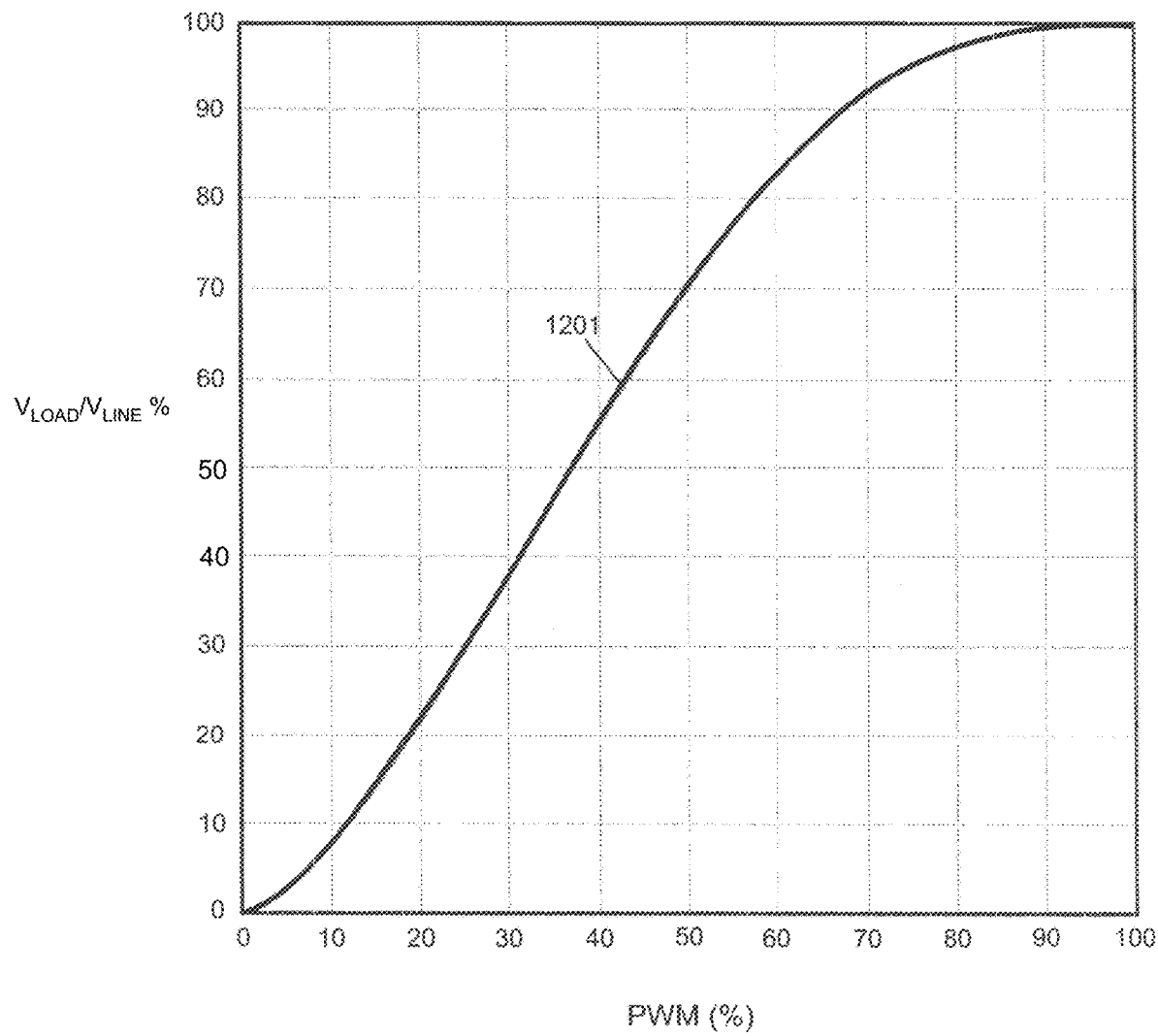
FIG. 12A depicts the resulting output voltage $V_{LOAD}$ as a percentage of $V_{LINE}$ for the power-control device of FIG. 9 as a function of the percentage PWM modulation (PWM %)
Figure 12B:
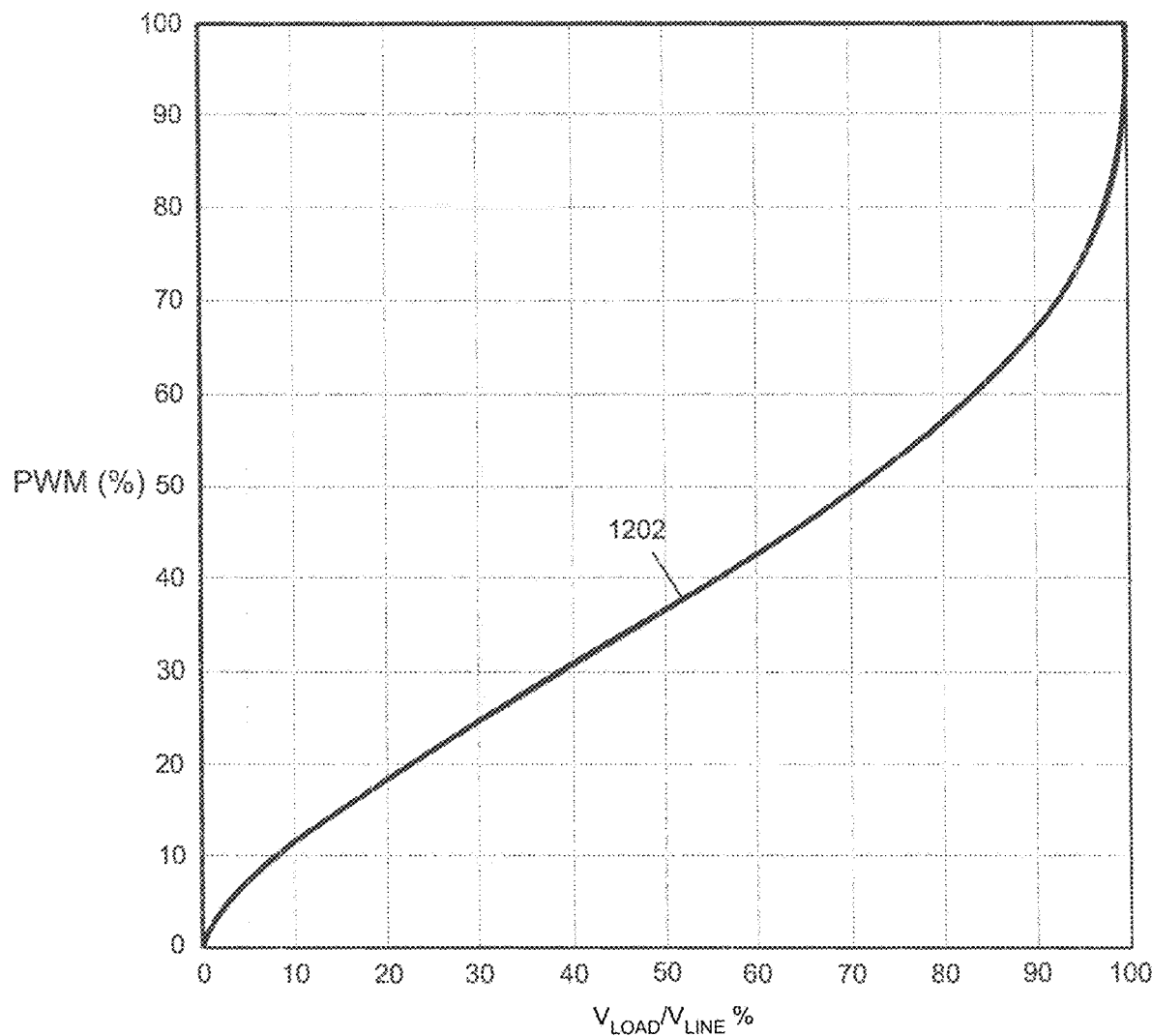
FIG. 12B depicts the PWM % modulation as a function of the output voltage $V_{LOAD}$ as a percentage of $V_{LINE}$ for the power-control device of FIG. 9.

FIG. 12A depicts the resulting output voltage $V_{LOAD}$ as a percentage of $V_{LINE}$ for power control device 600 or 900 as a function of the percentage PWM modulation (PWM %). The relationship between the PWM % modulation and $V_{LOAD}/V_{LINE}$% is nonlinear and shown by curve 1201. FIG. 12B depicts the PWM % modulation as a function of output voltage $V_{LOAD}$ as a percentage of $V_{LINE}$ for power-control device 600 or 900. Curve 1202 in FIG. 12B is the PWM transfer function for producing a linear voltage output relative to a linear input control signal.

Figure 13:
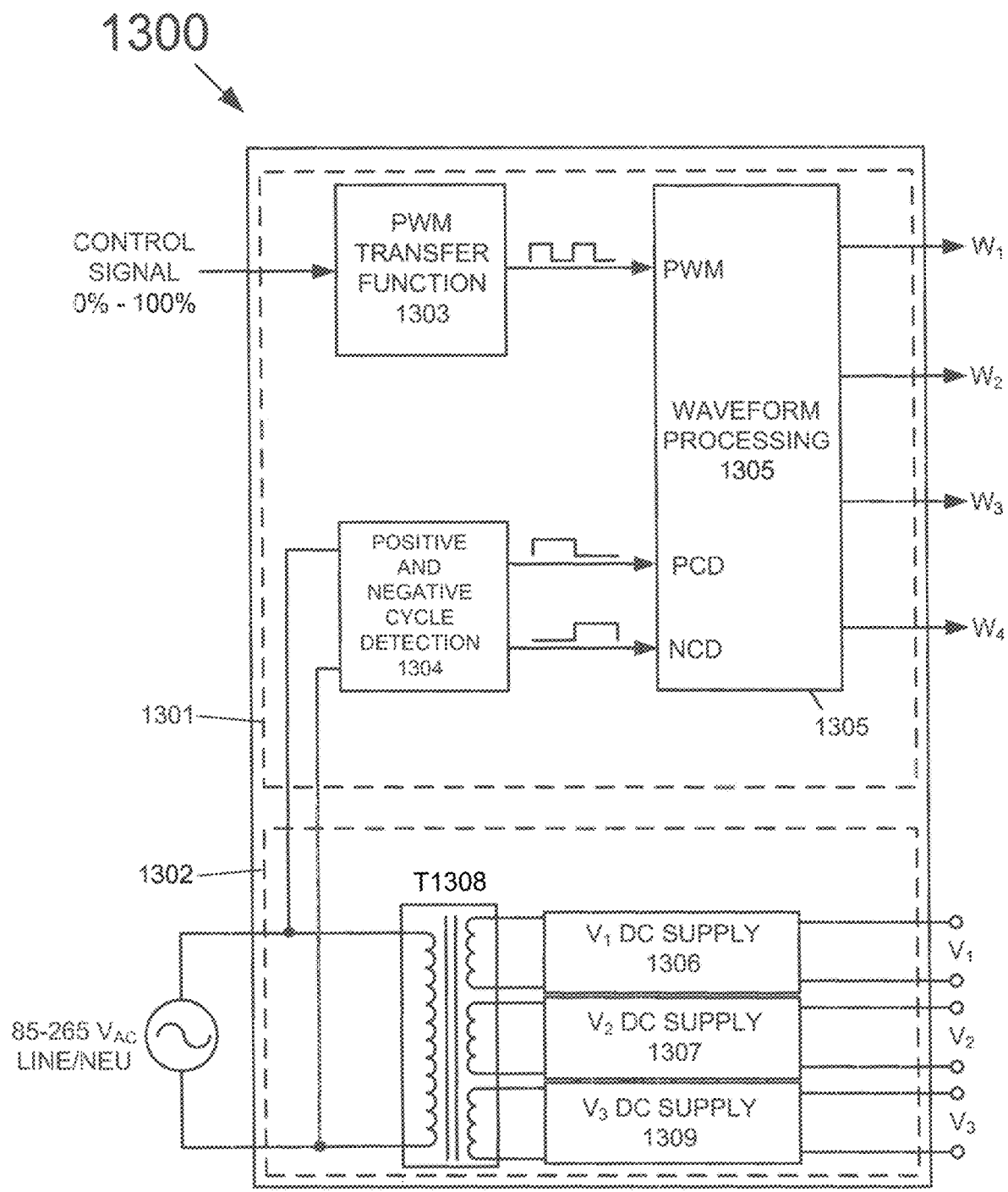
FIG. 13 depicts a functional block diagram of an exemplary embodiment of a general processing and power supply circuit for a power-control device according to the subject matter disclosed herein.

FIG. 13 depicts a functional block diagram of an exemplary embodiment of a general processing and power supply circuit 1300 for power-control device 900 according to the subject matter disclosed herein. General processing and power supply circuit 1300 comprises a signal processing section 1301 and a power supply section 1302.

In one exemplary embodiment, signal processing section 1301 comprises a PWM transfer function device 1303, a positive and negative cycle detector 1304 and a waveform processor 1305. PWM transfer function device 1303 receives a main PWM control signal that communicates a desired percentage of modulation, and generates in a well-known manner a PWM output control signal that is based on the transfer function depicted in FIG. 12B. The main PWM control signal received by PWM transfer function device 1303 may be analog, digital, or even a simple potentiometer. In one exemplary embodiment, PWM transfer function device 1303 outputs a $W_0$ depicted in FIG. 10. Positive and negative cycle detector 1304 receives a signal corresponding to $V_{AC}$ (i.e., $V_{LINE}$) and generates in a well-known manner a positive cycle detection (PCD) signal and a negative cycle detection (NCD) signal that respectively correspond to the positive portion and the negative portion of $V_{AC}$. Waveform processor 1305 receives the PWM output control signal from PWM transfer function device 1303 and the PCD and NCD signals and generates in a well-known manner PWM controls signals that control the operation of, for example, power-control device 900. In one exemplary embodiment, waveform processor 1305 generates PWM control signals $W_1$-$W_4$, which are depicted in FIG. 10. In one exemplary embodiment, PWM control signals $W_1$-$W_4$ are respectively coupled to I901-I904.

In one exemplary embodiment, power supply section 1302 includes two floating DC supplies 1306 and 1307, which respectively produce $V_1$ and $V_2$, depicted in FIG. 9. More specifically, power supply section 1302 comprises a transformer T1308 having a primary winding that is coupled to $V_{AC}$ and secondary windings coupled to DC supplies 1306 and 1307. DC supplies 1306 and 1307 generate $V_1$ and $V_2$ in a well-known manner. In one exemplary embodiment, the power requirements for power supply section 1302 are small, generally less than one watt. In one exemplary alternative embodiment, power supply section 1302 comprises a DC power supply 1309 that powers signal processing section 1301. For this exemplary alternative embodiment, PWM transfer function device 1303 receives the PWM control signal that communicates a desired percentage of modulation through, for example, an optical isolator, in which case, the $W_1$-$W_4$ outputs from waveform processor 1305 are respectively coupled directly into drivers D901-D904.

In one exemplary embodiment, general processing and power supply circuit 1300 is configured to generate PWM control signals $W_1$ and $W_2$ for controlling the operation of, for example, power-control circuit 600. In one exemplary embodiment, general processing and power supply circuit 1300 is configured to generate floating DC supply $V_1$ for power-control circuit 600.

Figure 14:
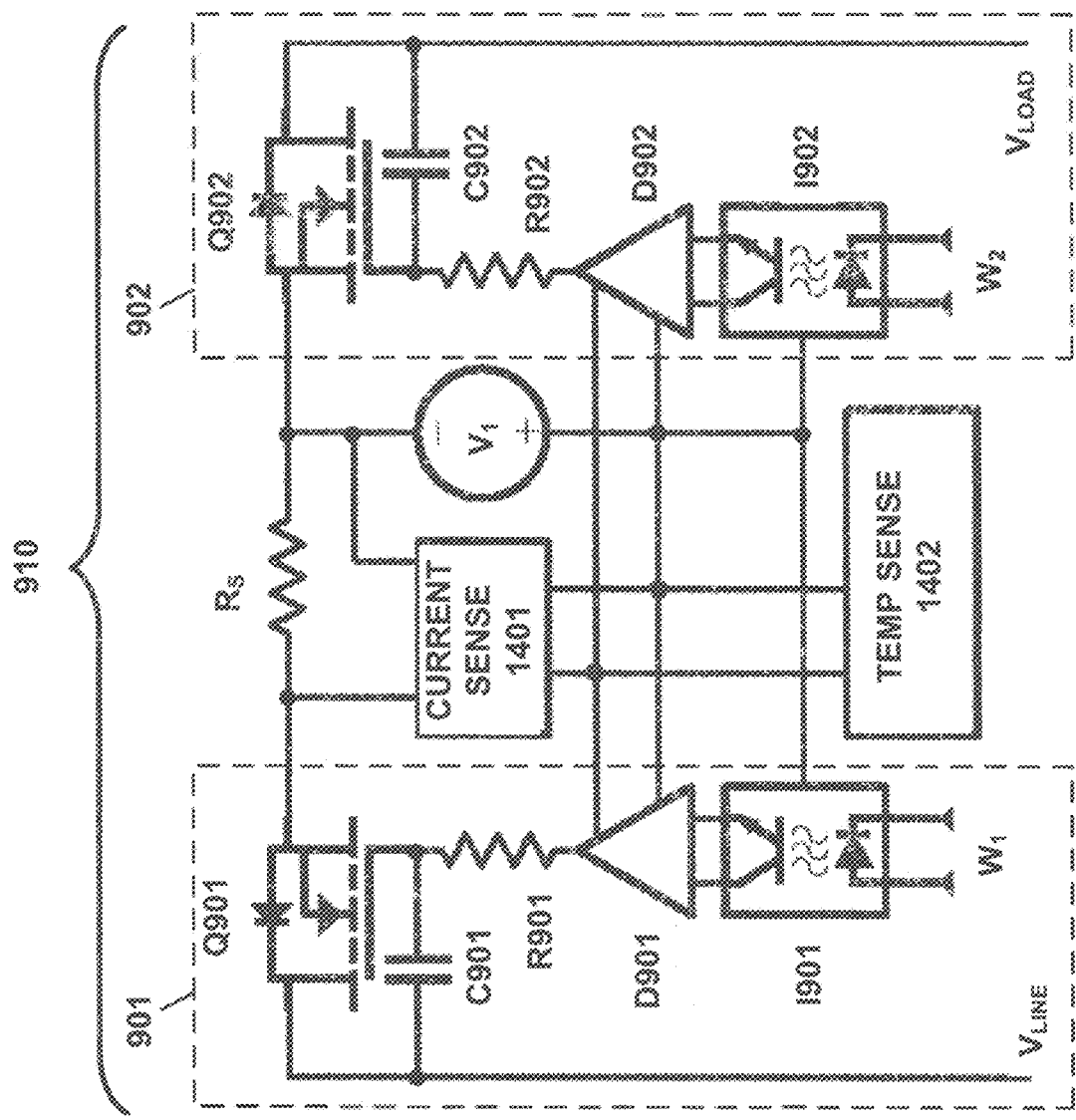
FIG. 14 depicts a functional block diagram of a power-control device having current-sensing and temperature-sensing capability according to the subject matter disclosed herein.

FIG. 14 depicts a functional block diagram of a power-control device 1400 having current-sensing and temperature-sensing capability according to the subject matter disclosed herein. In one exemplary embodiment, current flow through MOSFETs Q901 and Q902 can be detected by including a low-value shunt resistor $R_S$ between the sources of MOSFETs Q901 and Q902, as depicted in FIG. 14. Shunt resistor $R_S$ is also coupled to a local common provided by voltage source $V_1$. The voltage drop across shunt resistor $R_S$ is detected in a well-known manner by a current-sensing circuit 1401. Drivers D901 and D902 are also coupled to the local common and can be disabled as desired when a short-circuit condition is detected. Current flow through MOSFETS Q901 and Q902 may also be sensed by measuring the voltage across the MOSFETS $R_{ds}$ on by well-established methods for over current protection.

In one exemplary embodiment, thermal protection is provided by sensing the temperature of MOSFETs Q901 and Q902 and/or of a heatsink coupled to MOSFETs Q901 and Q902 by, for example, a thermistor (not shown). A temperature-sensing circuit 1402 can disable MOSFET drivers D901 and D902. It should be noted that current-sensing circuit 1401 and temperature-sensing circuit 1402 are depicted as being coupled to energy-import section 910 of power-control device 900 because after an over-current condition and/or an overtemperature condition has been sensed and drivers D901 and D902 have been disabled, energy-export section 920 of power-control device 900 remains enabled to export from $Z_L$ any remaining reactive energy. It should also be noted that the over-current and over-temperature sensing circuits depicted in FIG. 14 could be incorporated into power-control device 600 of FIG. 6.

Figure 15A:
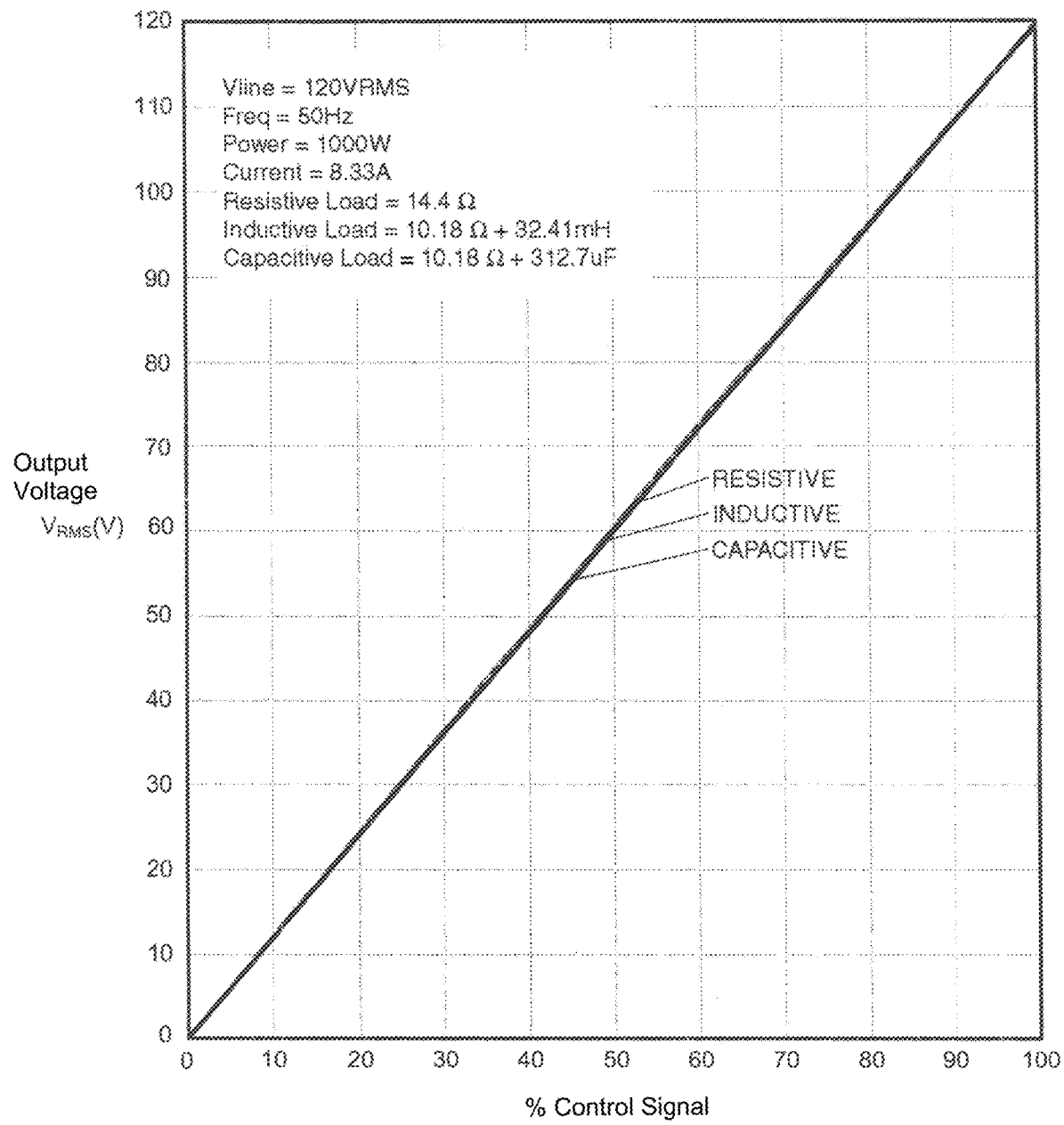
FIG. 15A depicts a simulated RMS output voltage $V_{RMS}$ for the power-control device of FIG. 9 as a function of percentage modulation (% Modulation) of the input voltage $V_{LINE}$ for each of a resistive load, an inductive load and a capacitive load.

FIG. 15A depicts a simulated RMS output voltage $V_{RMS}$ for power-control device 900 as a function of the Control Signal (FIG. 13) (% Control Signal) for each of a resistive load, an inductive load and a capacitive load. The linear relationship between % Control Signal and $V_{RMS}$ may be achieved by use of the circuit of FIG. 13. For the simulation of FIG. 15A, $V_{LINE}$ was set to be 120 $V_{RMS}$ at a frequency of 50 Hz. Input current was 8.33 $A_{RMS}$, and input power was 1000 W for 100% modulation. For the simulation, the resistive load was 14.4Ω; the inductive load was 10.18Ω+32.41 mH; and the capacitive load was 10.18Ω+312.7 µF. The RMS output voltages for the different three loads are essentially superimposed on each other.

Figure 15B:
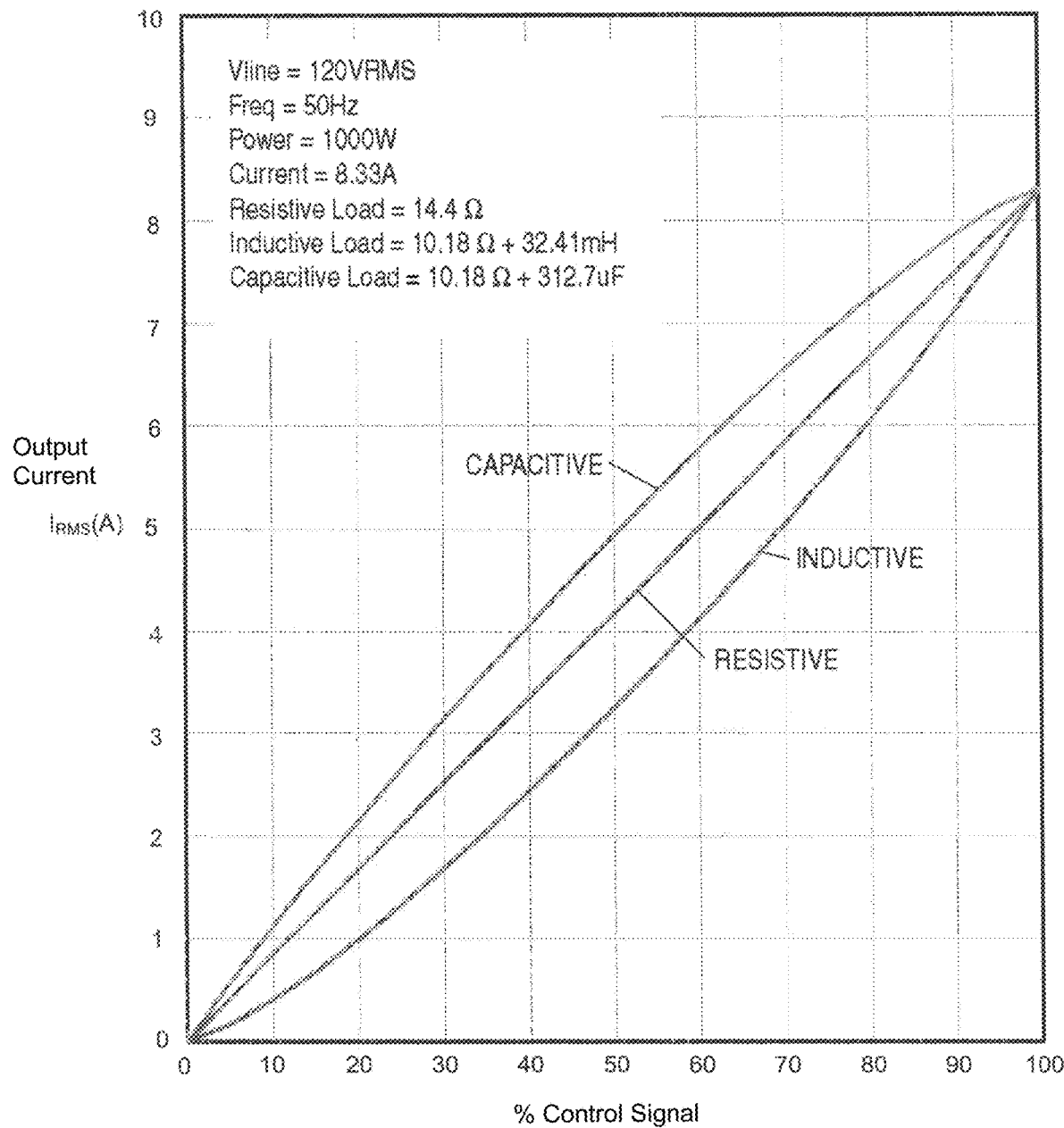
FIG. 15B depicts a simulated RMS output current $I_{RMS}$ for the power-control device of FIG. 9 as a function of percentage modulation (% Modulation) of the input voltage $V_{LINE}$ for the same simulation conditions as FIG. 15A.

FIG. 15B depicts a simulated RMS output current for power-control device 900 as a function of the Control Signal (FIG. 13) (% Control Signal) for the same simulation conditions as FIG. 15A. The substantially linear relationship between % Control Signal and $I_{RMS}$ may be achieved by use of the circuit of FIG. 13. The RMS output current $I_{RMS}$ for the three different loads are indicated in FIG. 15B. Output current for the inductive load is shown as being bowed downward, while output current for the capacitive load is shown as being bowed upward. Output current for the resistive load is shown between the curves for the inductive load and the capacitive load.

Figure 15C:
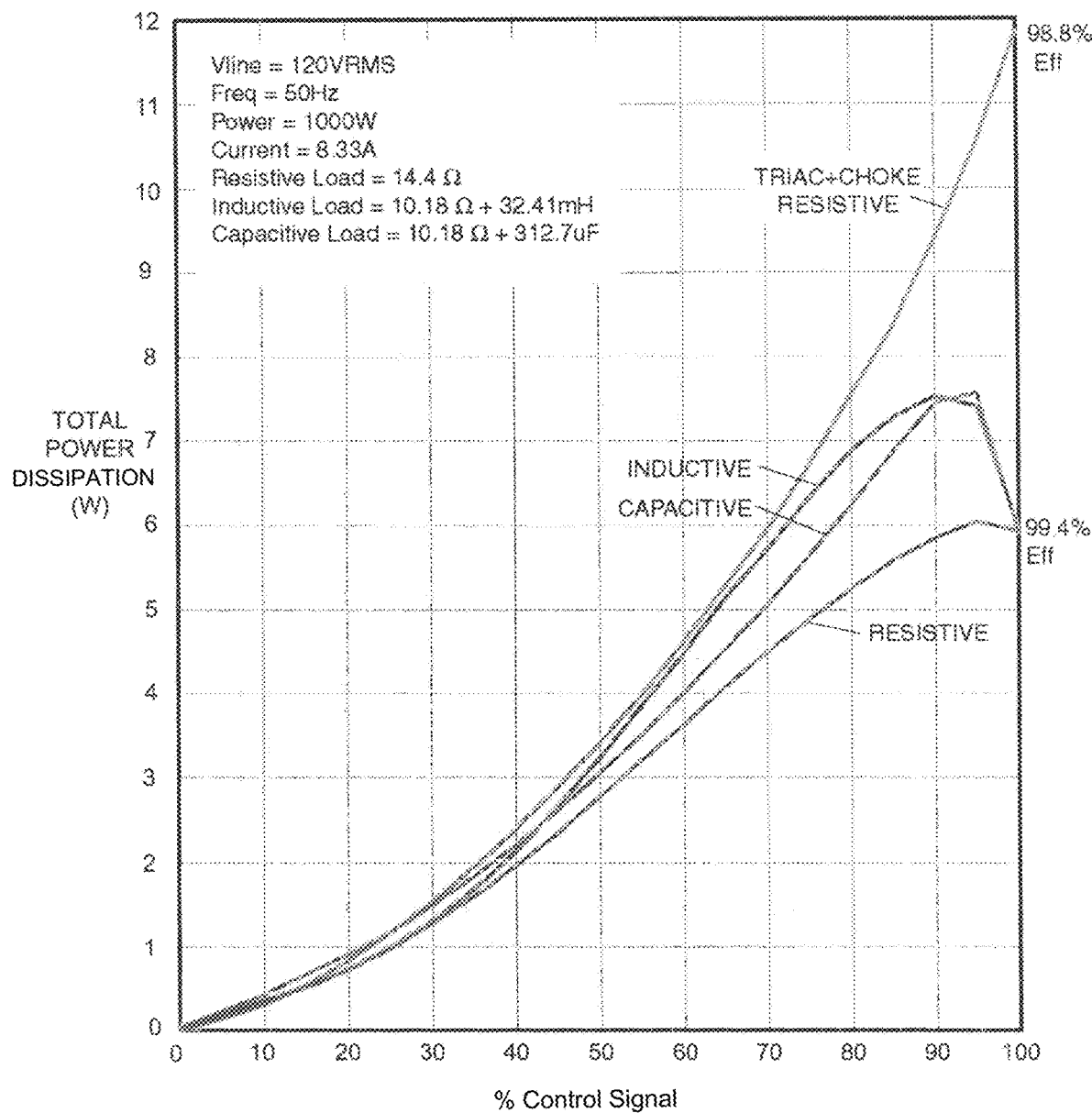
FIG. 15C depicts a simulated total power dissipation for the power-control device of FIG. 9 as a function of percentage modulation (% Modulation) of the input voltage $V_{LINE}$ for the same simulation conditions as FIG. 15A.

FIG. 15C depicts a simulated total power dissipation for power-control device 900 as a function of the Control Signal (FIG. 13) (% Control Signal) for the same simulation conditions as FIG. 15A. FIG. 15C also depicts for comparison a simulated power dissipation for the conventional thyristor or TRIAC power-control device 100 under the same conditions. Device 900 provides an efficiency of 99.4%, while the conventional thyristor power-control device 100 provides an efficiency of 98.8%. It should be understood that 99.4% efficiency is predicated on the $R_{ds}$ for a suitable MOSFET for example 40 milli-ohms.

The efficiency for both power-control device 900 and conventional power-control device 100 is very high; however, the real significant difference is the actual power dissipation of device 900 and that of device 100. In particular, for the simulation conditions, circuit 900 consumes 6 W while device 100 consumes 12 W. Thus, device 900 provides a 50% reduction in heatsinking and thermal management relative to device 100. That difference is important as the size and structure of any heatsinking, airflow, and thermal load requirements would be cut by half.

It should be understood that although the transistors of power-control devices 600 (FIG. 6) and 900 (FIG. 9) are depicted as MOSFETS, Insulated-Gate Bipolar Transistors (IGBTs) could replace the MOSFETs. IGBTs, however, do not have substrate diodes, so separate diodes would need to be coupled across the collector and emitter terminals of the IGBTs, resulting in a larger physical size and a greater power dissipation than associated with the MOSFETs. Nevertheless, IGBTs and diodes could replace the MOSFETS in FIGS. 6 and 9.

Although the foregoing disclosed subject matter has been described in some detail for purposes of clarity of understanding, it will be apparent that certain changes and modifications may be practiced that are within the scope of the appended claims. Accordingly, the present embodiments are to be considered as illustrative and not restrictive, and the subject matter disclosed herein is not to be limited to the details given herein, but may be modified within the scope and equivalents of any claims in this or a subsequent application.

The invention claimed is:

1. A power-control device for use with an alternating voltage $V_{AC}$ source producing an alternating voltage $V_{AC}$ waveform, the power-control device comprising:
   an input ($V_{LINE}$) terminal, a load terminal and a neutral (NEU) terminal;
   the $V_{LINE}$ terminal and the NEU terminal configured for coupling therebetween the alternating voltage $V_{AC}$ source to receive the alternating voltage $V_{AC}$ waveform;
   an energy-import portion coupled between the $V_{LINE}$ terminal and the load terminal, the energy-import portion being capable of importing energy to the load terminal during a first portion and a third portion of the alternating voltage $V_{AC}$ waveform when the alternating voltage $V_{AC}$ source is coupled between the $V_{LINE}$ terminal and the NEU terminal; and
   an energy-export portion coupled between the load terminal and the NEU terminal, the energy-export portion being capable of exporting energy from the load terminal during a second portion and a fourth portion of the alternating voltage $V_{AC}$ waveform when the alternating voltage $V_{AC}$ source is coupled between the $V_{LINE}$ terminal and the NEU terminal, wherein the first, second, third and fourth portions of the alternating voltage VAC waveform being equal to a period of the alternating voltage $V_{AC}$ waveform and respectively being consecutive during the period of the alternating voltage $V_{AC}$ waveform.

2. The power-control device according to claim 1, wherein the energy-import portion comprises:
   a first MOSFET comprising a first terminal, a second terminal and a control terminal, the first terminal of the first MOSFET being coupled to the $V_{LINE}$ terminal; and
   a second MOSFET comprising a first terminal, a second terminal and a control terminal, the second terminal of the second MOSFET being coupled to the second terminal of the first MOSFET and the first terminal of the second MOSFET being coupled to the load terminal.

3. The power-control device according to claim 2, wherein the energy-export portion comprises:
   a third MOSFET comprising a first terminal, a second terminal and a control terminal, the first terminal of the third MOSFET being coupled to the load terminal; and
   a fourth MOSFET comprising a first terminal, a second terminal and a control terminal, the second terminal of the fourth MOSFET being coupled to the second terminal of the third MOSFET and the first terminal of the fourth MOSFET being coupled to the NEU terminal.

4. The power-control device according to claim 3, wherein the energy-import portion further comprises:
   a first driver comprising an output coupled to the control terminal of the first MOSFET, the first driver being capable of outputting a first drive signal in response to a first pulse width modulation (PWM) control signal, the first PWM control signal corresponding to the first portion of alternating voltage $V_{AC}$ waveform;
   a second driver comprising an output coupled to the control terminal of the second MOSFET, the second driver being capable of outputting a second drive signal in response to a second PWM control signal, the second PWM control signal corresponding to the third portion of the alternating voltage $V_{AC}$ waveform, and
   wherein the energy-export portion further comprises:
   a third driver comprising an output coupled to the control terminal of the third MOSFET, the third driver being capable of outputting a third drive signal in response to a third PWM control signal, the third PWM control signal corresponding to the second portion of the alternating voltage $V_{AC}$ waveform;
   a fourth driver comprising an output coupled to the control terminal of the fourth MOSFET, the fourth driver being capable of outputting a fourth drive signal in response to a fourth PWM control signal, the fourth PWM signal corresponding to the fourth portion of the alternating voltage $V_{AC}$ waveform.

5. The power-control device according to claim 4, wherein the first driver is capable of outputting a first synchronous rectification drive signal in response to a first synchronous rectification control signal, the first synchronous rectification control signal corresponding to the third and fourth portions of the alternating voltage $V_{AC}$ waveform,
   wherein the second driver is capable of outputting a second synchronous rectification drive signal in response to a second synchronous rectification control signal, the second synchronous rectification control signal corresponding to the first and second portions of the alternating voltage $V_{AC}$ waveform,
   wherein the third driver is capable of outputting a third synchronous rectification drive signal in response to a third synchronous rectification control signal, the third synchronous rectification control signal corresponding to the third and fourth portions of the alternating voltage $V_{AC}$ waveform, and
   wherein the fourth driver is capable of outputting a fourth synchronous rectification drive signal in response to a fourth synchronous rectification control signal, the fourth synchronous rectification control signal corresponding to the first and second portions of the alternating voltage $V_{AC}$ waveform.

6. The power-control device according to claim 5, wherein the energy-import portion further comprises:
   a first optical isolator comprising an input and an output, the input of the first optical isolator being configured to receive the first PWM control signal and the first synchronous rectification control signal, and the output of the first optical isolator being coupled to the first driver; and
   a second optical isolator comprising an input and an output, the input of the second optical isolator being configured to receive the second PWM control signal and the second synchronous rectification control signal, and the output of the second optical isolator being coupled to the second driver, and
   wherein the energy-export portion further comprises:
   a third optical isolator comprising an input and an output, the input of the third optical isolator being configured to receive the third PWM control signal and the third synchronous rectification control signal, and the output of the third optical isolator being coupled to the third driver; and
   a fourth optical isolator comprising an input and an output, the input of the fourth optical isolator being configured to receive the fourth PWM control signal and the fourth synchronous rectification control signal, and the output of the fourth optical isolator being coupled to the fourth driver.

7. The power-control device according to claim 6, wherein the energy-import portion further comprises a first power source, the first power source comprising a first terminal and a second terminal, the first terminal of the first power source being coupled to the second terminal of the first MOSFET and the second terminal of the second MOSFET, and the second terminal of the first power source being coupled to the first and second drivers and the first and second optical isolators, and wherein the energy-export portion further comprises a second power source, the second power source comprising a first terminal and a second terminal, the first terminal of the second power source being coupled to the second terminal of the third MOSFET and the second terminal of the fourth MOSFET, and the second terminal of the second power source being coupled to the third and fourth drivers and the third and fourth optical isolators.

8. A power-control device, comprising:
an input ($V_{LINE}$) terminal, a load terminal and a neutral (NEU) terminal;
a first linear-switching device coupled between the $V_{LINE}$ terminal and the load terminal, the first linear-switching device comprising:
a first MOSFET comprising a first terminal, a second terminal and a control terminal, the first terminal of the first MOSFET being coupled to the $V_{LINE}$ terminal, and the first MOSFET being turned on in response to a first portion of a first control signal that is coupled to the control terminal and being turned off in response to a second portion of the first control signal;
a first voltage supply isolated from the NEU terminal, the first voltage supply comprising a first terminal coupled to the second terminal of the first MOSFET and a second terminal of a second MOSFET;
a first driver isolated from the NEU terminal, the first driver comprising an input, an output and a power terminal, the output of the first driver coupling the first control signal to the control terminal of the first MOSFET in response to a main control signal received from a signal source that is isolated from the first driver, and the power terminal being coupled to the second terminal of the first voltage supply;
the second MOSFET comprising a first terminal, a second terminal and a control terminal, the first terminal of the second MOSFET being coupled to the load terminal, the second terminal of the second MOSFET being coupled to the second terminal of the first MOSFET, and the second MOSFET being turned on in response to a first portion of a second control signal that is coupled to the control terminal and being turned off in response to a second portion of a third control signal;
a second driver isolated from the NEU terminal, the second driver comprising an input, an output and a power terminal, the output of the second driver coupling the second control signal to the control terminal of the second MOSFET in response to the main control signal received from the signal source, the signal source being isolated from the second driver, and the power terminal being coupled to the second terminal of the first voltage supply;
the first linear-switching device being capable of sourcing energy to the load terminal during a first portion and a third portion of an alternating voltage $V_{AC}$ waveform when the alternating voltage $V_{AC}$ source is coupled between the $V_{LINE}$ terminal and the NEU terminal, the first portion of the first control signal corresponding to the first portion of the alternating voltage $V_{AC}$ waveform and the first portion of the second control signal corresponding to the third portion of the alternating voltage $V_{AC}$ waveform.

9. The power-control device according to claim 8, further comprising a processing and power source section, the processing and power source section comprising:
a pulse width modulation (PWM) waveform processor capable of receiving a main PWM control signal and generating first through fourth PWM control signals and first through fourth synchronous rectification control signals; and
a transformer comprising a primary winding and a first and second secondary windings, the primary winding being capable of being coupled to the alternating voltage $V_{AC}$ source, the first secondary winding being capable of being coupled to a first power source, and the second secondary winding being capable of being coupled to a second power source.

10. The power-control device according to claim 9, further comprising:
a second linear-switching device coupled between the load terminal and the NEU terminal the second linear-switching device comprising:
a third MOSFET comprising a first terminal, a second terminal and a control terminal, the first terminal of the third MOSFET being coupled to the $V_{LOAD}$ terminal the third MOSFET being turned on in response to a second portion of the third control signal and is held on by a synchronous rectifier signal for the third and fourth portions of the control signal that is coupled to the control terminal and being turned off in response to a second portion of the third control signal;
a second voltage supply isolated from the NEU terminal, the second voltage supply comprising a first terminal coupled to the second terminal of the third MOSFET and a second terminal of the fourth MOSFET;
a third driver isolated from the NEU terminal, the third driver comprising an input, an output and a power terminal, the output of the third driver coupling the third control signal to the control terminal of the third MOSFET in response to the main control signal received from the signal source, the signal source being isolated from the third driver, and the power terminal being coupled to the second terminal of the second voltage supply;
a fourth MOSFET comprising a first terminal, a second terminal and a control terminal, the first terminal of the fourth MOSFET being coupled to the NEU terminal, the second terminal of the fourth MOSFET being coupled to the second terminal of the third MOSFET, and the fourth MOSFET being turned on in response to the synchronous rectification signal for the first and second portions of the alternating voltage $V_{AC}$ waveform of the PWM control signal during the fourth portion of the alternating voltage $V_{AC}$ waveform that is coupled to the control terminal;
a fourth driver isolated from the NEU terminal, the fourth driver comprising an input, an output and a power terminal, the output of the fourth driver coupling the fourth control signal to the control terminal of the fourth MOSFET in response to the main control signal received from the signal source, the signal source being isolated from the fourth driver, and the power terminal being coupled to the second terminal of the second voltage supply;

the second linear-switching device being capable of sinking energy from the load terminal during a second portion and a fourth portion of the alternating voltage $V_{AC}$ waveform when the alternating voltage $V_{AC}$ source is coupled between the $V_{LOAD}$ terminal and the NEU terminal, the first, second, third and fourth portions of the alternating voltage $V_{AC}$ waveform spanning a period of the alternating voltage $V_{AC}$ waveform and respectively being consecutive during the period of the alternating voltage $V_{AC}$ waveform.

11. The power-control device according to claim 10, wherein the first linear-switching device further comprises:
   a first feedback network coupled between the first terminal and the control terminal of the first MOSFET, the first feedback network coupling a first voltage transition at the first terminal of the first MOSFET to the control terminal of the first MOSFET, and the first voltage transition being caused by the first MOSFET being turned off in response to the second portion of the first control signal;
   a second feedback network coupled between the first terminal and the control terminal of the second MOSFET, the second feedback network coupling a second voltage transition at the first terminal of the second MOSFET to the control terminal of the second MOSFET, and the second voltage transition being caused by the second MOSFET being turned off in response to a second portion of the second control signal, and wherein the second linear-switching device further comprises:
      a third feedback network coupled between the first terminal and the control terminal of the third MOSFET, the third feedback network coupling a third voltage transition at the first terminal of the third MOSFET to the control terminal of the third MOSFET, and the third voltage transition being caused by the third MOSFET being turned off in response to the second portion of the third control signal; and
      a fourth feedback network coupled between the first terminal and the control terminal of the fourth MOSFET, the fourth feedback network coupling a fourth voltage transition at the first terminal of the fourth MOSFET to the control terminal of the fourth MOSFET, and the fourth voltage transition being caused by the fourth MOSFET being turned off in response to a second portion of the fourth control signal.

12. The power-control device according to claim 11, wherein the first linear-switching device further comprises;
   a first optical isolator comprising an input and an output, the input of the first optical isolator being configured to receive the first control signal, and the output of the first optical isolator being coupled to the input of the first driver; and
   a second optical isolator comprising an input and an output, the input of the second optical isolator being configured to receive the second control signal, and the output of the second optical isolator being coupled to the input of the second driver, and wherein the second linear-switching device further comprises:
   a third optical isolator comprising an input and an output, the input of the third optical isolator being configured to receive the third control signal, and the output of the third optical isolator being coupled to the input of the third driver; and
   a fourth optical isolator comprising an input and an output, the input of the fourth optical isolator being configured to receive the fourth control signal, and the output of the fourth optical isolator being coupled to the input of the fourth driver.

13. The power-control device according to claim 12, further comprising a processing and power source section, the processing and power source section comprising:
   a pulse width modulation (PWM) waveform processor capable of receiving the main control signal and generating the first through fourth PWM control signals; and
   a transformer comprising a primary winding and first and second secondary windings, the primary winding being capable of being coupled to the alternating voltage $V_{AC}$ source, the first secondary winding being capable of being coupled to the first voltage supply and the second secondary winding being capable of being coupled to the second voltage supply.

14. A power-control device comprising:
   an input ($V_{LINE}$) terminal and a load terminal; and;
   a first linear-switching device coupled between the $V_{LINE}$ terminal and the load terminal, the first linear-switching device comprising a first MOSFET and a second MOSFET, the first MOSFET comprising a first terminal, a second terminal and a control terminal, the first terminal of the first MOSFET being coupled to the $V_{LINE}$ terminal, and the second MOSFET comprising a first terminal, a second terminal and a control terminal, the second terminal of the second MOSFET being coupled to the second terminal of the first MOSFET and the first terminal of the second MOSFET being coupled to the load terminal, the first linear-switching device being capable of sourcing energy to the load terminal during a first portion and a third portion of an alternating voltage $V_{AC}$ waveform when the alternating voltage $V_{AC}$ source is coupled to the $V_{LINE}$ terminal and further comprising:
   a neutral (NEU) terminal; and
   a second linear-switching device coupled between the load terminal and the NEU terminal, the second linear-switching device comprising a third MOSFET and a fourth MOSFET, the third MOSFET comprising a first terminal, a second terminal and a control terminal, the first terminal of the third MOSFET being coupled to the load terminal, and the fourth MOSFET comprising a first terminal, a second terminal and a control terminal, the second terminal of the fourth MOSFET being coupled to the second terminal of the third MOSFET and the first terminal of the fourth MOSFET being coupled to the NEU terminal, the second linear-switching device being capable of sinking energy from the load terminal during a second portion and a fourth portion of the alternating voltage $V_{AC}$ waveform when the alternating voltage $V_{AC}$ source is coupled between the $V_{LINE}$ terminal and the NEU terminal, the first, second, third and fourth portions of the alternating voltage $V_{AC}$ waveform spanning a period of the alternating voltage $V_{AC}$ waveform and respectively being consecutive during the period of the alternating voltage $V_{AC}$ waveform.

15. The power-control device according to claim 14, wherein the first linear-switching device further comprises:
   a first driver comprising an output coupled to the control terminal of the first MOSFET, the first driver being capable of outputting a first drive signal in response to a first pulse width modulation (PWM) control signal and being capable of outputting a first synchronous rectification drive signal in response to a first synchronous rectification control signal, the first PWM signal corresponding to the first portion of alternating voltage $V_{AC}$ waveform, and the first synchronous rectification control signal corresponding to the third and fourth portions of the alternating voltage $V_{AC}$ waveform; and a second driver comprising an output coupled to the control terminal of the second MOSFET, the second driver being capable of outputting a second drive signal in response to a second PWM control signal and being capable of outputting a second synchronous rectification drive signal in response to a second synchronous rectification control signal, the second PWM signal corresponding to the third portion of the alternating voltage $V_{AC}$ waveform, and the second synchronous rectification control signal corresponding to the first and second portions of the alternating voltage $V_{AC}$ waveform, and wherein the second linear-switching device further comprises:
  a third driver comprising an output coupled to the control terminal of the third MOSFET, the third driver being capable of outputting a third drive signal in response to a third PWM control signal and being capable of outputting a third synchronous rectification drive signal in response to a third synchronous rectification control signal, the third PWM signal corresponding to the second portion of the alternating voltage $V_{AC}$ waveform, and the third synchronous rectification control signal corresponding to the third and fourth portions of the alternating voltage $V_{AC}$ waveform; and
  a fourth driver comprising an output coupled to the control terminal of the fourth MOSFET, the fourth driver being capable of outputting a fourth drive signal in response to a fourth PWM control signal and being capable of outputting a fourth synchronous rectification drive signal in response to a fourth synchronous rectification control signal, the fourth PWM signal corresponding to the fourth portion of the alternating voltage $V_{AC}$ waveform, and the fourth synchronous rectification control signal corresponding to the first and second portions of the alternating voltage $V_{AC}$ waveform.

16. The power-control device according to claim 15, wherein the first linear-switching device further comprises:
  a first optical isolator comprising an input and an output, the input of the first optical isolator being configured to receive the first PWM control signal and the first synchronous rectification control signal, and the output of the first optical isolator being coupled to the first driver; and
  a second optical isolator comprising an input and an output, the input of the second optical isolator being configured to receive the second PWM control signal and the second synchronous rectification control signal, and the output of the second optical isolator being coupled to the second driver, and wherein the second linear-switching device further comprises:
  a third optical isolator comprising an input and an output, the input of the third optical isolator being configured to receive the third PWM control signal and the third synchronous rectification control signal, and the output of the third optical isolator being coupled to the third driver; and
  a fourth optical isolator comprising an input and an output, the input of the fourth optical isolator being configured to receive the fourth PWM control signal and the fourth synchronous rectification control signal, and the output of the fourth optical isolator being coupled to the fourth driver.

17. The power-control device according to claim 16, wherein the first linear-switching device further comprises a first power source, the first power source comprising a first terminal and a second terminal, the first terminal of the first power source being coupled to the second terminal of the first MOSFET and the second terminal of the second MOSFET, and the second terminal of the first power source being coupled to the first and second drivers and the first and second optical isolators, and
  wherein the second linear-switching device further comprises a second power source, the second power source comprising a first terminal and a second terminal, the first terminal of the second power source being coupled to the second terminal of the third MOSFET and the second terminal of the fourth MOSFET, and the second terminal of the first power source being coupled to the third and fourth drivers.

18. The power-control device according to claim 17, further comprising a processing and a power source section, the processing and power source section comprising:
  a PWM waveform processor capable of receiving a main PWM control signal and generating the first through fourth PWM control signals and the first through fourth synchronous rectification control signals; and
  a transformer comprising a primary winding and first and second secondary windings, the primary winding being capable of being coupled to the alternating voltage $V_{AC}$ source, the first secondary winding being capable of being coupled to the first isolated power source and the second secondary winding being capable of being coupled to the second isolated power source.

* * * * *